(12) United States Patent
Ring et al.

(10) Patent No.: US 11,543,588 B2
(45) Date of Patent: Jan. 3, 2023

(54) OPTICAL DIELECTRIC PLANAR WAVEGUIDE PROCESS

(71) Applicant: POET Technologies, Inc., San Jose, CA (US)

(72) Inventors: William Ring, High Bridge, NJ (US); Miroslaw Florjanczyk, Kanata (CA); Suresh Venkatesan, Los Gatos, CA (US)

(*) Notice: Subject to any disclaimer, the term of this patent is extended or adjusted under 35 U.S.C. 154(b) by 0 days.

(21) Appl. No.: 17/509,786

(22) Filed: Oct. 25, 2021

(65) Prior Publication Data

US 2022/0043210 A1 Feb. 10, 2022

Related U.S. Application Data

(63) Continuation of application No. 16/932,970, filed on Jul. 20, 2020, now Pat. No. 11,156,779, which is a continuation of application No. 16/258,292, filed on Jan. 25, 2019, now Pat. No. 10,718,905, which is a continuation-in-part of application No. 16/036,179, filed on Jul. 16, 2018, now Pat. No. 10,962,715, which is a continuation-in-part of application No. 16/036,234, filed on Jul. 16, 2018, now Pat. No. 10,795,079, which is a continuation-in-part of application No. 16/036,151, filed on Jul. 16, 2018, now Pat. No. 10,551,561, which is a continuation-in-part of application No. 16/036,208, filed on Jul. 16, 2018, now Pat. No. 10,663,660.

(60) Provisional application No. 62/621,659, filed on Jan. 25, 2018.

(51) Int. Cl.
| | |
|---|---|
| G02B 6/132 | (2006.01) |
| C23C 16/34 | (2006.01) |
| C23C 16/56 | (2006.01) |
| H01J 37/32 | (2006.01) |
| C23C 16/50 | (2006.01) |

(52) U.S. Cl.
CPC .............. *G02B 6/132* (2013.01); *C23C 16/34* (2013.01); *C23C 16/56* (2013.01); *C23C 16/50* (2013.01); *H01J 37/32091* (2013.01); *H01J 2237/3321* (2013.01)

(58) Field of Classification Search
None
See application file for complete search history.

(56) References Cited

U.S. PATENT DOCUMENTS 7,043,133 B2 * 5/2006 Johnson .................. G02B 6/132
385/141

* cited by examiner

*Primary Examiner* — Jerry Rahll
(74) *Attorney, Agent, or Firm* — Tue Nguyen

(57) ABSTRACT

A method for depositing silicon oxynitride film structures is provided that is used to form planar waveguides. These film structures are deposited on substrates and the combination of the substrate and the planar waveguide is used in the formation of optical interposers and subassemblies. The silicon oxynitride film structures are deposited using low thermal budget processes and hydrogen-free oxygen and hydrogen-free nitrogen precursors to produce planar waveguides that exhibit low losses for optical signals transmitted through the waveguide of 1 dB/cm or less. The silicon oxynitride film structures and substrate exhibit low stress levels of less than 20 MPa.

20 Claims, 20 Drawing Sheets

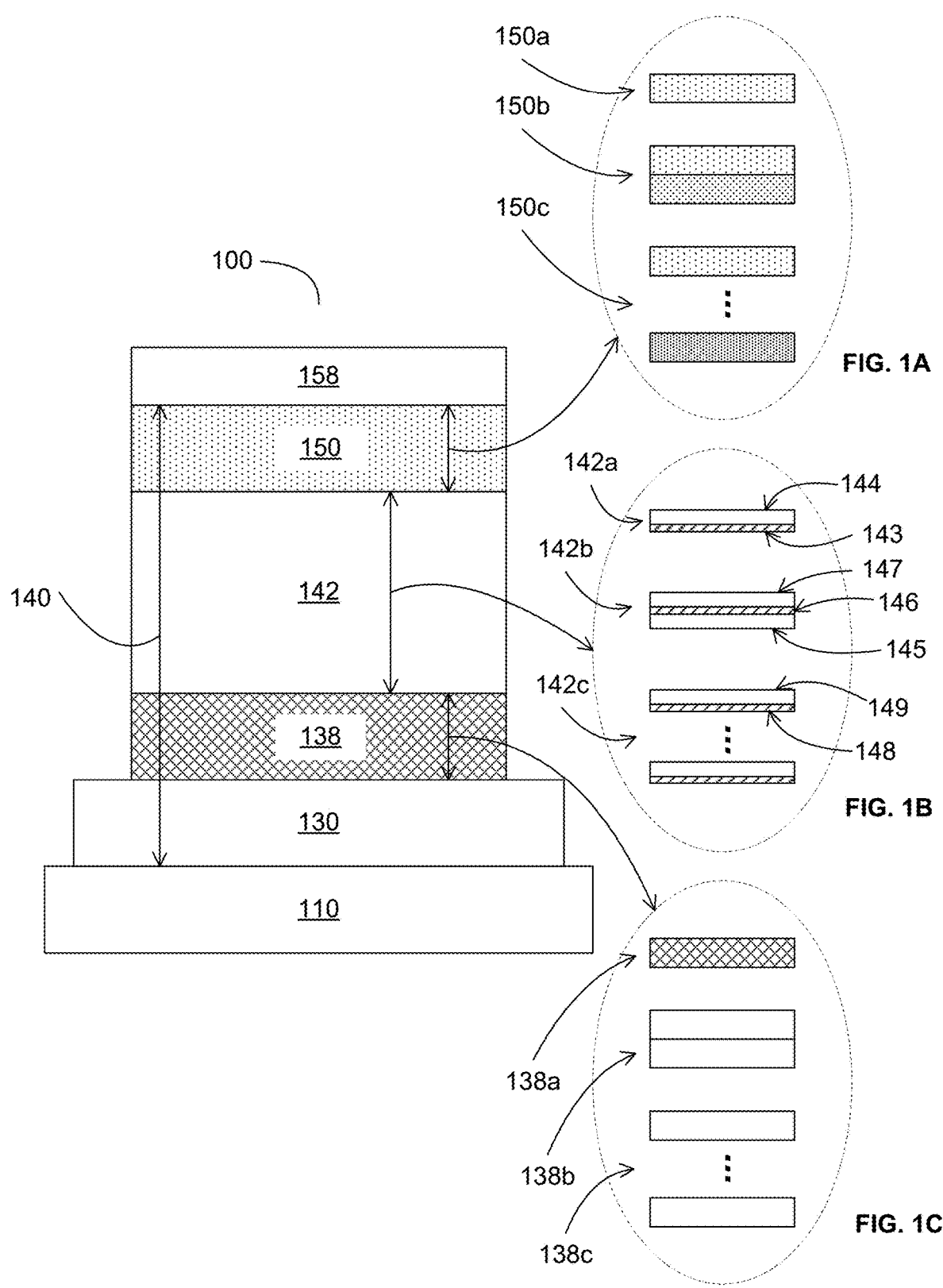

Forming a stack of SiON dielectric films at low temperature having low stress and low optical loss
400

FIG. 4A

Forming a stack of SiON dielectric films with each dielectric film deposited at low temperature and having low stress and low optical loss
420

FIG. 4B

Forming a stack of SiON dielectric film on a substrate, including a buffer layer, one or more optional bottom spacer layers, a repeat stack of one or more dielectric layers, one or more optional top spacer layers, and an optional top layer
440

Patterning the stack to form a waveguide
450

FIG. 4C

```
┌─────────────────────────────────────────────────┐
│ Providing a substrate, wherein the substrate    │
│ comprises one or more devices coupled to an     │
│ interconnection layer                           │
│ 1200                                            │
└─────────────────────────────────────────────────┘
                       │
                       ▼
┌─────────────────────────────────────────────────┐
│ Depositing a stack of dielectric layers on the  │
│ substrate                                       │
│ 1210                                            │
└─────────────────────────────────────────────────┘
                       │
                       ▼
┌─────────────────────────────────────────────────┐
│ Patterning the stack to form a waveguide        │
│ 1220                                            │
└─────────────────────────────────────────────────┘
```

*FIG. 12A*

```
┌─────────────────────────────────────────────────┐
│ Providing a substrate, wherein the substrate    │
│ comprises at least a first device coupled to an │
│ interconnection layer, wherein the substrate    │
│ comprises a waveguide patterned from a stack    │
│ of dielectric layers                            │
│ 1240                                            │
└─────────────────────────────────────────────────┘
                       │
                       ▼
┌─────────────────────────────────────────────────┐
│ Coupling a second device to the substrate,      │
│ wherein the device is configured to interface   │
│ between the waveguide and the at least a device │
│ 1250                                            │
└─────────────────────────────────────────────────┘
                       │
                       ▼
┌─────────────────────────────────────────────────┐
│ Coupling an optical fiber to the substrate,     │
│ wherein the optical fiber is configured to      │
│ interface with the waveguide                    │
│ 1260                                            │
└─────────────────────────────────────────────────┘
```

*FIG. 12B*

OPTICAL DIELECTRIC PLANAR WAVEGUIDE PROCESS

The present application is continuation of U.S. Utility patent application Ser. No. 16/932,970, filed on Jul. 20, 2020, entitled: "OPTICAL DIELECTRIC PLANAR WAVEGUIDE PROCESS" (OPE105A), which is continuation of U.S. Utility patent application Ser. No. 16/258,292, filed on Jan. 25, 2019, entitled: "OPTICAL DIELECTRIC PLANAR WAVEGUIDE PROCESS" (OPE105) and continuation in-part of and claims priority from U.S. Provisional Patent Application Ser. No. 62/621,659, filed on Jan. 25, 2018, entitled: "Optical Dielectric Interposer" (OPE010-PRO), U.S. Utility patent application Ser. No. 16/036,151, filed on Jul. 16, 2018, entitled: "Optical Dielectric Waveguide Structures" (OPE101), U.S. Utility patent application Ser. No. 16/036,179, filed on Jul. 16, 2018, entitled: "Methods for Optical Dielectric Waveguide Structures" (OPE102), U.S. Utility patent application Ser. No. 16/036,208, filed on Jul. 16, 2018, entitled: "OPTICAL DIELECTRIC WAVEGUIDE SUBASSEMBLY STRUCTURES" (OPE103), U.S. Utility patent application Ser. No. 16/036,234, filed on Jul. 16, 2018, entitled: "METHODS FOR OPTICAL DIELECTRIC WAVEGUIDE SUBASSEMBLY STRUCTURE" (OPE104), all of which are incorporated herein by reference.

FIELD OF THE INVENTION

The present invention relates to optoelectronic communication systems, and more particularly to a planar waveguide structure that is used in submount assemblies in these systems. Optical dielectric interposers are formed from the integration and patterning of this planar waveguide structure with a substrate to form compact interposers and optical submount assemblies that provide low loss in optoelectronic packages used for optical signal routing and transmission.

BACKGROUND

Waveguides are used in optical communication networks for the transmission and routing of optical signals. For the transmission of the optical signals over long distances, waveguides can take the form of optical fibers, thin strands of glass that are used to transfer data over distances that can span tens of kilometers. Within the networks of long range optical fibers are signal processing nodes that contain packaged photonic and optoelectronic circuits that are used to perform various functions such as to encode, send, receive, decode, multiplex, and de-multiplex, among other optical and electrical signal processing functions, the optical signals that are delivered to these processing nodes via the optical fibers. And within the optoelectronic circuits in these processing nodes, optical signals are transmitted via free space and through short lengths of waveguide. These short lengths of waveguide are used to guide signals to a variety of small packaged devices or components that can transfer, combine, split, and route optical signals as the demands of the network require.

Optoelectronic packages at signal processing nodes in optical communications networks generally include an optical submount assembly, which typically consists of one or more optical die (such as lasers and photodetectors), and that can include either the means for the free space transmission of optical signals or the planar waveguides and associated optical routing components, all of which are enclosed in an hermetically-sealed cavity formed by a cap and a substrate. A submount assembly can include, for example. a substrate or interposer, the optical routing components, and the signal-generating and signal-receiving devices and components.

Routing of optical signals from the optical fibers to components on the submount assembly have historically been accomplished via transmission in free space, and to some extent, via planar optical waveguides on the submount assembly. Optical transmission in free space can require lenses to focus and direct the optical signals between components in the optical circuits and can require large spatial volumes to accommodate these lenses. The large spatial volumes can lead to undesirably large package sizes for these optical circuits. Additionally, the transmission of the signals in free space can result in significant signal losses from uncontrolled scattering and reflection.

Currently, the capability for fabricating planar waveguide structures of sufficient thickness with low stress is limited, and therefore, a need exists in the art of optoelectronic packaging for a planar waveguide structure that can be deposited onto a substrate, and from which compact and economical interposers and submount assemblies can be formed. Thus, there is a need in the art for a method to produce compact, planar optical waveguide structures that exhibit low optical loss without deformation of the underlying substrate.

DESCRIPTION OF THE DRAWINGS

The accompanying drawings illustrate various embodiments of systems, methods, and other aspects of the invention. It will be apparent to a person skilled in the art that the illustrated element boundaries (e.g., boxes, groups of boxes, or other shapes) in the figures represent one example of the boundaries. In some examples, one element may be designed as multiple elements, or multiple elements may be designed as one element. In some examples, an element shown as an internal component of one element may be implemented as an external component in another, and vice versa.

Various embodiments of the present invention are illustrated by way of example, and not limited by the appended figures, in which like references indicate similar elements, and in which:

FIG. 1A-1C show cross-sectional schematic views of the inventive dielectric film structure for the formation of integrated planar waveguide structures: FIG. 1A a cross-sectional view of a single or multilayer dielectric top spacer layer structure for the inventive planar dielectric waveguide structure; FIG. 1B a cross-sectional view of a multilayer, repeating silicon oxynitride film structure for the inventive planar dielectric waveguide structure; and FIG. 1C a cross-sectional view of a single or multilayer dielectric bottom spacer layer structure for the inventive planar dielectric waveguide structure;

FIG. 4A-4C show steps for forming some embodiments of the inventive dielectric film structure FIG. 4A at low temperature and having low stress and low optical loss, FIG. 4B with each dielectric film deposited at low temperature and having low stress and low optical loss, and FIG. 4C that include a substrate with a buffer layer, one or more optional bottom spacer layers, a repeating stack of one or more dielectric layers, one or more optional top spacer layers, and an optional top layer, followed by patterning of the stack to form a waveguide;

FIG. 7A without optical/electrical devices, and FIG. 7B with optical/electrical devices;

FIG. 8A without optical/electrical devices and FIG. 8B with optical/electrical devices;

FIG. 9A without surface mounted optical or electrical devices and FIG. 9B with surface mounted optical or electrical device;

FIG. 10A shown without the top mounted optical or electrical devices in place, and FIG. 10B with top mounted optical or electrical device; also shown is the position of an optical fiber relative to the planar waveguide in an embodiment;

FIG. 11A with inventive dielectric stack mounted via bond pads to the substrate as a discrete optical waveguide component, FIG. 11B with inventive dielectric stack mounted to the substrate as a discrete optical waveguide component and aligned with discrete optical and electrical devices, and aligned to an optical fiber, FIG. 11C with inventive dielectric stack mounted to the substrate as a discrete optical waveguide component, for which the substrate contains integrated electrical devices, and FIG. 11D with inventive dielectric stack mounted to the substrate as a discrete optical waveguide component and aligned with discrete optical and electrical devices, and aligned to an optical fiber for an embodiment in which the substrate contains integrated electrical devices;

FIG. 12A-12B show steps in the fabrication of embodiments of providing a patterned dielectric waveguide structure FIG. 12A on a substrate with one or more integrated devices in the substrate that are coupled to an interconnect layer, and FIG. 12B on a substrate with one or more integrated devices in the substrate that are coupled to the inventive planar waveguide through an interconnect layer and a device, and to an optical fiber that is configured to interface with the planar waveguide;

SUMMARY

Figure 2A:
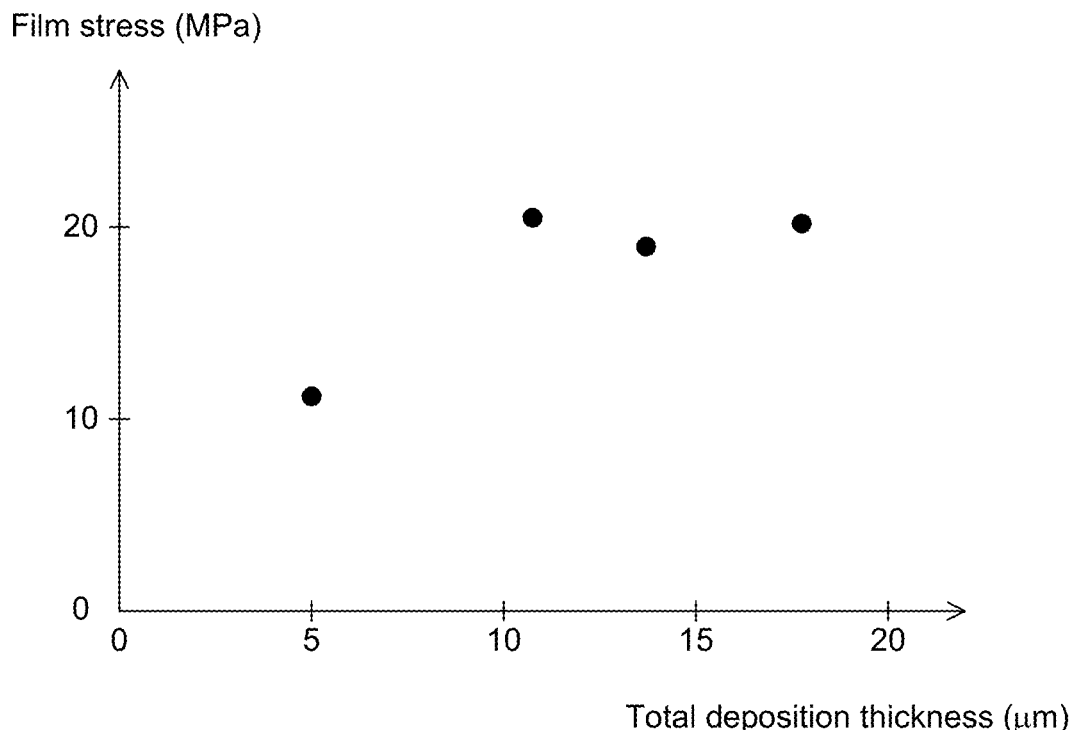
FIG. 2A-2B show measured film stress in accordance with embodiments for FIG. 2A dielectric films deposited at various film thicknesses, and FIG. 2B dielectric films of various refractive indexes.

Embodiments of the present invention are directed to the fabrication of integrated planar dielectric waveguides that are formed and patterned on substrates. The combination of an integrated planar waveguide and a substrate, to form an optical dielectric interposer, serves as a subcomponent of an optical submount assembly for an optoelectronic package. Optical losses in dielectric waveguides are minimized with the use of nitrogen and oxygen precursors that do not contain hydrogen.

The present invention is based, in part, on the development of a dielectric waveguide structure that transmits optical signals with low loss, is integrated into a substrate and thereby reduces fabrication costs, is deposited at low processing temperatures of less than 400° C., and preferably less than or at approximately 300° C., and is fabricated with low stress to prevent stress-induced delamination of the film structure and deformation of the substrate. The inventive structure and method for producing the structure enables the fabrication of waveguides over a wide range of thicknesses up to 20 micrometers and greater. The benefits of this capability, as further described herein, provide superior optical and mechanical performance and superior economic benefits in comparison to the current state of the art.

Waveguides that are fabricated using the inventive techniques described herein, have low residual stresses and thus very thick layered structures can be deposited. The thicker, multilayer waveguide structures obtainable with the inventive method, coupled with low residual hydrogen concentrations in the deposited layers, allow for low optical loss. Further, the thick waveguides obtainable with the inventive method are provided at a thermal budget and can thus be fabricated on substrates that contain metallization layers and integrated electrical and optoelectrical devices.

DETAILED DESCRIPTION

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

An "interposer" as used herein and throughout this disclosure refers to, but is not limited to, a substrate that provides mechanical support and electrical or optical interface routing from one or more electrical, optical, and optoelectrical devices to another. Interposers are typically used to route optical or electrical connections from various devices or die that are mounted on, or connected to, the interposer. An "optical interposer" is an interposer that provides for the optical interfacing between optical devices mounted or connected thereon.

A "submount assembly" as used herein and throughout this disclosure refers to, but is not limited to, an assembly that includes a substrate, typically an interposer, that is populated with one or more optical, optoelectrical, and electrical devices.

A "substrate" as used herein and throughout this disclosure refers to, but is not limited to, a mechanical support upon which an interposer is formed. Substrates may include, but not be limited to, silicon, indium phosphide, gallium arsenide, silicon, silicon oxide-on-silicon, silicon dioxide-on-silicon, silica-on-polymer, glass, a metal, a ceramic, a polymer, or a combination thereof. Substrates may include a semiconductor or other substrate material, and one or more layers of materials such as those used in the formation of an interconnect layer.

An "optical die" as used herein and throughout this disclosure refers to, but is not limited to, a discrete optical device such as a laser or photodetector that can be positioned into a submount assembly as a component of an optical or optoelectronic circuit.

An "optoelectronic package" as used herein and throughout this disclosure refers to, but is not limited to, an assembly that is typically hermetically sealed, and that typically includes a submount assembly and a cap; the package typically provides electrical, optical, or both electrical and optical interconnects for combining with external optoelectronic, electronic, and optical components as in, for example, an optical communications network, an optical circuit, or an electrical circuit.

An "optical waveguide" as used herein and throughout this disclosure refers to, but is not limited to, a medium for transmitting optical signals.

"Optical signals" as used herein and throughout this disclosure refers to, but is not limited to, electromagnetic signals typically in the infrared and visible light ranges of the electromagnetic spectrum that are encoded with information.

A "semiconductor" as used herein and throughout this disclosure refers to, but is not limited to, a material having an electrical conductivity value falling between that of a conductor and an insulator. The material may be an elemental material or a compound material. A semiconductor may include, but not be limited to, an element, a binary alloy, a tertiary alloy, and a quaternary alloy. Structures formed using a semiconductor or semiconductors may include a single semiconductor material, two or more semiconductor materials, a semiconductor alloy of a single composition, a semiconductor alloy of two or more discrete compositions, and a semiconductor alloy graded from a first semiconductor alloy to a second semiconductor alloy. A semiconductor may be one of undoped (intrinsic), p-type doped, n-typed doped, graded in doping from a first doping level of one type to a second doping level of the same type, and graded in doping from a first doping level of one type to a second doping level of a different type. Semiconductors may include, but are not limited to, III-V semiconductors, such as those between aluminum (Al), gallium (Ga), and indium (In) with nitrogen (N), phosphorous (P), arsenic (As) and tin (Sb), including for example GaN, GaP, GaAs, InP, InAs, AN and AlAs.

"Silicon oxynitride" as used herein and throughout this disclosure refers to, but is not limited to, a dielectric material that is formed by a combination of constituent elements of silicon, oxygen, and nitrogen. In some instances, the term "silicon oxynitride" can refer to silicon oxides and silicon nitrides in the general sense that silicon oxides and silicon nitrides are silicon oxynitrides with very low or insignificant levels of either the nitrogen in the case of silicon oxides, and oxygen in the case of silicon nitrides. Film properties, such as the refractive index, can be controlled or varied by varying the concentrations and the ratios of the constituent elements of silicon, oxygen, and nitrogen, and to some extent, by the concentrations of impurities in the films. The removal of nitrogen or the reduction of nitrogen to low levels, for example, in one film of a film stack, does not change the designation of the material as silicon oxynitride within the context of this disclosure. Similarly, the removal of oxygen or the reduction of oxygen to very low levels does not change the designation of the resulting material as a silicon oxynitride. Materials with low or unmeasurable levels of either nitrogen or oxygen should, therefore, be viewed as silicon oxynitrides within the context of this disclosure. The ratio of silicon to oxygen to nitrogen in silicon oxynitride films can vary over a wide range and variations in the ratio of these constituent elements can lead to variations in the refractive indices of silicon oxynitride films as described herein. The concentrations of impurities in the films, from the deposition processes used to form the films, can also influence the indices of refraction of the silicon oxynitride films. Silicon oxynitride is electrically insulating and optically transparent.

"Silicon oxide" as used herein and throughout this disclosure refers to, but is not limited to, a dielectric material that is formed from a combination of silicon and oxygen, and in some instances may contain other elements such as hydrogen, for example, as a byproduct of the deposition method. In its most common form, the ratio of oxygen to silicon is 2:1 (silicon dioxide) but variations in this ratio remain within the scope of the definition of silicon oxide as used for the silicon oxide films in this disclosure. Similarly, variations in stoichiometry are to be anticipated and applicable for films specifically referred to in this disclosure as silicon dioxide.

"Silicon nitride" as used herein and throughout this disclosure refers to, but is not limited to, a dielectric material that is formed from a combination of silicon and nitrogen, and in some instances may contain other elements such as hydrogen, for example, as a byproduct of the deposition method. In its most common form, the ratio of nitrogen to silicon is 4:3, but variations in this ratio remain within the scope of the definition of silicon nitride as used for the silicon nitride films in this disclosure.

A "metal" as used herein and throughout this disclosure refers to, but is not limited to, a material (element, compound, and alloy) that has good electrical and thermal conductivity. This may include, but not be limited to, gold, chromium, aluminum, silver, platinum, nickel, copper, rhodium, palladium, tungsten, and combinations of such materials.

An "electrode", "contact", "track", "trace", or "terminal" as used herein and throughout this disclosure refers to, but is not limited to, a material having good electrical conductivity and that is typically, optically opaque. This includes structures formed from thin films, thick films, and plated films for example of materials including, but not limited to, metals such as gold, chromium, aluminum, silver, platinum, nickel, copper, rhodium, palladium, tungsten, and combinations of such materials. Other electrode configurations may employ combinations of metals, for example, a chromium adhesion layer and a gold electrode layer.

A "precursor" as used herein and throughout this disclosure is a material in gaseous or vapor form that contains one or more of the constituent elements of a material targeted for deposition. Molecular silane ($SiH_4$), for example, contains elements of silicon and hydrogen, and is a widely used precursor for depositing films in chemical vapor deposition processes, for example, that contain silicon (such as silicon, silicon dioxide, silicon nitride, silicon oxynitride, etc.) Deposition of films such as silicon dioxide, for example, requires at least a second precursor to provide the oxygen in applications in which silane is used since the silane does not contain oxygen. Molecular oxygen ($O_2$) is often used as a precursor with silane in the deposition of thin films of silicon dioxide to provide the oxygen atoms required for the silicon oxide formation. It is important to note that not all of the elements contained in the precursor or precursors are required or desired in the deposited films. In the case of silane, for example, when used as a precursor to deposit thin films of silicon dioxide, residual hydrogen can lead to a reduction in the quality of the films relative to stoichiometrically pure films without the hydrogen.

References to "an embodiment", "another embodiment", "yet another embodiment", "one example", "another example", "yet another example", "for example" and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in an embodiment" does not necessarily refer to the same embodiment.

Planar optical waveguides that can be fabricated on substrates, and that can further be utilized in the formation of interposers, and ultimately in submount assemblies, offer the potential for significant reduction in fabrication complexity and in optoelectronic package sizes over current methods. The integration and patterning of planar waveguide structures on substrates allow for the transmission and distribution of optical signals within the subassemblies, which can eliminate or reduce the requirements to mount discrete optical components to the subassembly. Integrated waveguide structures also allow for the formation of optical device structures, such as filters, gratings, and spot size converters, for example, directly onto the substrate of the interposer or submount assembly, the integration of which can lead to significant cost advantages. Further, the ability to pattern and integrate planar waveguide structures on substrates that contain metal interconnect layers enables the use of integrated optoelectrical devices with the planar waveguides and the planar waveguide device structures fabricated on the substrates. This combination of integrated optical components with electrical interconnect layers requires low thermal budget fabrication processes so as to not damage the interconnect layers present in the substrates or interposers upon which the planar waveguides are fabricated.

In an embodiment, a method for depositing a planar dielectric layer of silicon oxynitride on a substrate is provided which includes maintaining the substrate at a predetermined temperature and exposing the substrate surface to a plasma enhanced chemical vapor deposition process containing a silicon-containing precursor gas that may or may not contain hydrogen, a nitrogen-containing precursor that does not include hydrogen, and an oxygen-containing precursor that does not contain hydrogen. Advantages of the inventive low thermal budget process for forming the inventive dielectric waveguide structure 140 include predetermined temperatures that are sufficiently low to allow for substrates with metallization layers that would otherwise not be implementable with higher thermal budget processes.

In general, the thermal budget of a manufacturing process is the total amount of thermal energy that is transferred to the substrate during an operation that is performed at elevated temperature, and is proportional to the temperature and duration of each of the steps in the given high temperature process. Lower temperature processes can typically withstand much longer durations without deleteriously impacting the substrate or features of the substrate that were formed in prior processes. Additionally, lower temperature processes in general, and more specifically, lower thermal budget processes, allow for features to be incorporated into the substrate that would not otherwise be available in cases in which high thermal budget processes are required. In the present inventive process and method, low thermal budget processing provides advantages in the formation of dielectric film structures that include 1) a reduction in the potential for deformation of the substrates, and 2) the capability to incorporate integrated electrical devices and metallized layers into the substrate prior to the fabrication of the planar waveguide structures. High thermal budget processes in which the substrates are subjected to high temperatures, even for short durations, can lead to warpage and other forms of deformation of the substrate. Additionally, integrated electrical devices and metallization layers might also be subject to damage by processes at higher thermal budgets or require more robust and potentially more expensive processing to reduce this potential for damage. It is therefore advantageous for deposition processes for planar waveguide structures to have sufficiently low thermal budgets so as to not result in deformation or warping of the substrate, and so as not to result in damage to integrated electrical devices or metallized layers that are formed on the substrate prior to the formation of the waveguides. Additionally, the use of low thermal budget processes allows for the use of more economically favorable materials and processing techniques that may not have the robustness to withstand higher thermal budget processes. In the case of material selection, for example, the use of low thermal budget processes can allow for a variety of polymeric materials to be utilized that are commonly implemented in semiconductor fabrication schemes that would otherwise not withstand exposure to high temperature, or high thermal budget processes. Similarly, other materials and combinations of materials can be utilized with low thermal budget fabrication schemes that are susceptible to damage upon exposure to higher thermal budget processes.

In applications in which electrical devices or metallization layers are incorporated into the substrate, low thermal budget processes offer significantly greater levels of flexibility in processing over higher thermal budget processes. In integrated device structures, the metallization layers are typically the most susceptible to the introduction of damage from high thermal budget processes, although other aspects of the device might also be affected by excursions to high temperatures.

A metallized layer structure in or on a substrate typically consists of one or more patterned metal layers that are insulated with one or more layers of dielectric material to electrically isolate the metal layers. For example, a metallization layer structure can consist of multiple layers of patterned aluminum, copper, or other metals, or a combination of metals that are encapsulated within a dielectric material such as silicon dioxide, silicon nitride, a polymer, or other insulating material that provides electrical isolation between traces formed by the metal layers. The metallized layers with the dielectric insulation layers can be fabricated using either subtractive processing such as metal deposition followed by an etching step to pattern the metal layers or additive processing, such as damascene and dual-damascene processing in which dielectric intermetal layers are patterned, etched, and then filled with metal to form the metal traces that are subsequently used to interconnect devices that will ultimately be positioned or fabricated on the substrate. In the case of aluminum and alloys of aluminum, subtractive processes are most commonly used in which an aluminum layer is deposited, patterned, and etched to form a patterned metal interconnect layer and then covered with a dielectric to electrically isolate and protect, among other important aspects, the traces created in the aluminum layer. Conversely, in the case of copper metallization, damascene processes are most commonly used. In a damascene process, a dielectric layer is deposited, patterned, and etched to form trenches that are subsequently filled with copper to form the metal interconnect traces. The copper-filled dielectric structures are then subjected to a planarization step to remove excess copper and then capped with a dielectric layer to isolate and protect the copper layer below. For both the subtractive and additive processes, the steps are repeated for applications in which multiple metal layers are implemented in the structure. In cases in which multiple layers of metal are required, allowance must be made to vertically interconnect the metal layers as required by the circuit design. This overview of forming metallization layer structures is a simplified overview but nonetheless highlights some of the key aspects of metallization layer formation that can be used to form the metallization layer on a substrate prior to the formation of the inventive planar dielectric waveguide structure. The formation of metallization layers using either subtractive or additive processes are well known in the art of integrated circuit manufacturing and applicable to the formation of metallization layers on substrates used to form optoelectronic interposers and subassemblies.

The ultimate temperature for a substrate with one or more metal layers, in the extreme case, is limited by the melting point temperature for the metal, although other deleterious effects are often observed at temperatures much lower than the melting temperature for the metal. For applications in which metallization layers utilize aluminum, the melting point for which is approximately 660° C., low thermal budget processes are particularly enabling due to the susceptibility of the aluminum to reflow at temperatures much lower than the melting point. The reduction in appearance of other effects in addition to metal reflow, such as void formation, diffusion, and alloying with adjacent materials, for example, among other potential damage mechanisms are also minimized using lower thermal budget processes.

In an embodiment, a method for depositing a planar dielectric layer of silicon oxynitride on a substrate is provided which includes maintaining the substrate at a predetermined temperature of less than 500 C and exposing the substrate surface to a plasma enhanced chemical vapor deposition process containing a silicon-containing precursor gas that may or may not contain hydrogen, a nitrogen-containing precursor that does not include hydrogen, and an oxygen-containing precursor that does not contain hydrogen. In another embodiment, a method for depositing a planar dielectric layer of silicon oxynitride on a substrate is provided which includes maintaining the substrate at a predetermined temperature of less than 400 C and exposing the substrate surface to a plasma enhanced chemical vapor deposition process containing a silicon-containing precursor gas that may or may not contain hydrogen, a nitrogen-containing precursor that does not include hydrogen, and an oxygen-containing precursor that does not contain hydrogen. And in yet another embodiment, a method for depositing a planar dielectric layer of silicon oxynitride on a substrate is provided which includes maintaining the substrate at a predetermined temperature of less than or approximately equal to 300 C and exposing the substrate surface to a plasma enhanced chemical vapor deposition process containing a silicon-containing precursor gas that may or may not contain hydrogen, a nitrogen-containing precursor that does not include hydrogen, and an oxygen-containing precursor that does not contain hydrogen. In embodiments, low thermal budget film deposition processes, as described herein, are used to form low stress film structures as shown in FIG. 1 for dielectric film structure 140.

Thick dielectric films of greater than a few micrometers for use as waveguides can provide transmission and routing pathways with desirably low levels of optical signal attenuation. Optical absorption is minimized in the current invention with the use of hydrogen-free precursors for oxygen and nitrogen that produce low levels of nitrogen-hydrogen bonding in deposited films, and when combined with the low stress levels of these deposited films, enable thick film structures as described in this disclosure to be fabricated. A low concentration of residual hydrogen-nitrogen bonding in the as-deposited films with the use of the hydrogen-free precursors provides the desirably low levels of optical absorption with a low thermal budget deposition method, and the means for deposited relatively thick dielectric layers that are low in stress. Thus, the inventive method provides a means for producing thick dielectric films that have low stress, low optical absorption, and that are fabricated with low thermal budget processes.

Optical and electrical devices that are fabricated in, and utilized with, dielectric interposer layers that are formed with a low thermal budget enable a wide range of substrate functionality and integration. Integrated dielectric waveguides in dielectric interposers, for example, that can be fabricated with low stress and with low optical loss, allow for increased levels of integration. Low stress levels allow for minimal substrate deformation particularly in thin substrates. Low optical loss allows for higher density components and smaller overall package sizes for submount assemblies. Additionally, dielectric interposers that can be deposited at temperatures that do not lead to degradation of temperature sensitive metallization layers allow for the fabrication of waveguides on substrates that include metallization. Substrates that contain integrated metallization layers includes a wide range of optical device assemblies that require electrical contact layers to interconnect opto-electrical devices to one another within the submount assembly, to devices within the substrate, and to other assemblies connected to the submount assembly. The ability to fabricate integrated waveguides on metalized CMOS structures, for example, enables an expansive range of functionality and applications in integrated communications technology.

In exemplary embodiments, planar dielectric film structures of multiple layers of silicon oxynitride are formed on a substrate and patterned into waveguides using hydrogen-free precursors for the nitrogen and oxygen components of the deposited silicon oxynitride. The inventive processes can produce patterned waveguides on substrates with optical losses that are typically less than 1 dB/cm and that exhibit post-deposition stress levels of less than 20 MPa. The inventive processes in embodiments use plasma enhanced chemical vapor deposition (PECVD) with process chemistries that do not utilize hydrogen-containing nitrogen and oxygen precursors. Residual hydrogen in silicon oxynitride films has been linked to high levels of loss for optical signals transmitted through waveguides fabricated from silicon oxynitride reportedly due to the formation of high levels of nitrogen-hydrogen bonds in the deposited films. Nitrogen-hydrogen bonds in deposited films are known to absorb optical signals at wavelengths commonly used in optical fiber communication networks. In the inventive process, the incorporation of the hydrogen, and the formation of the nitrogen-hydrogen bonds, is limited in the deposited films by the use of nitrogen and oxygen precursor gases that do not contain hydrogen. The inventive process and method, therefore, provide a preferred approach to forming low loss optical waveguide structures by combining a dielectric stack structure and a low thermal budget process that minimizes nitrogen-hydrogen bonds in the silicon oxynitride. The low thermal budget process utilizes non-hydrogen-containing nitrogen and oxygen precursors during the dielectric film deposition to provide waveguides that exhibit low optical signal loss.

Although the use of hydrogen-free precursors in the inventive dielectric film deposition process for the formation of the inventive film structure can result in significantly lower film deposition rates relative to processes that utilize hydrogen-containing precursors, the combination of the inventive process with these film structures enable a range of innovations as a result of the reductions in optical signal loss and residual stresses in the deposited films. The use of hydrogen-free nitrogen precursors and hydrogen-free oxygen precursors greatly reduces the formation of nitrogen-hydrogen bonds in the deposited silicon oxynitride films, and therefore, significantly reduces the absorption of optical signals in waveguides fabricated from these films in comparison to processes that utilize hydrogen-containing precursors.

Further areas of applicability of the present invention will become apparent from the detailed description provided herein. It should be understood that the detailed description of exemplary embodiments is intended for illustration purposes only and is, therefore, not intended to necessarily limit the scope of the present invention.

An embodiment of the inventive dielectric waveguide structure is shown in FIG. 1. The inventive dielectric waveguide structure is a stack of dielectric films deposited on a substrate 110 to form optical dielectric interposer 100. In an embodiment, the substrate is silicon. In other embodiments, the substrate is GaAs, InP, SiGe, SiC, or another semiconductor. In yet other embodiments, the substrate is aluminum nitride, aluminum oxide, silicon dioxide, quartz, glass, sapphire, or another ceramic or dielectric material. In yet other embodiments, the substrate is a metal. And in yet other embodiments, the substrate is a layered structure of one or more of a semiconductor, a ceramic, and a metal. It is to be understood that the substrate can be any material that provides a suitable mechanical support. It is to be further understood that a substrate with an interconnect layer that contains electrical lines and traces, separated with intermetal dielectric material, is a substrate.

The optical dielectric interposer 100 includes a planar waveguide structure formed on substrate 110. In the preferred embodiment, the planar waveguide structure includes a buffer layer 130, spacer layer 138, a repeating stack of silicon oxynitride films 142, a top spacer layer 150, and an optional top layer 158.

In preferred embodiments, buffer layer 130 is one or more layers of silicon dioxide or silicon oxynitride. In some embodiments, the buffer layer is a layer of silicon oxynitride. In a preferred embodiment, the buffer layer 130 is a silicon oxynitride layer, 5000 nm in thickness, with an index of refraction of 1.55. In other embodiments, the buffer layer 130 is silicon oxynitride with refractive index of 1.55 and is thicker than 2000 nm. In other embodiments, the buffer layer 130 is a silicon dioxide layer with a refractive index of approximately 1.445. In other embodiments, the buffer layer 130 is a silicon dioxide layer with a refractive index of approximately 1.445 that is greater than 2000 nm in thickness. In a preferred embodiment, the buffer layer 130 is a silicon dioxide layer that is approximately 4000 nm in thickness and with a refractive index of approximately 1.445.

Buffer layer 130 can be a composite layer of one or more layers of silicon dioxide or silicon oxynitride with varying thicknesses that in some embodiments sum to greater than 4000 nm in total thickness. Similarly, the buffer layer 130, in some preferred embodiments, can be a composite layer of one or more layers with varying refractive index, that when combined, provide a total thickness of greater than 4000 nm and a composite refractive index in the range of 1.4 to 2.02.

In preferred embodiments, spacer layer 138 is one or more layers of silicon dioxide or silicon oxynitride. In a preferred embodiment, the spacer layer 138 is a single spacer layer 138a of silicon oxynitride, 500 nm in thickness, with an index of refraction of 1.55. In some embodiments, single spacer layer 138a is a layer of a single material, such as silicon dioxide. In other preferred embodiments, single spacer layer 138a is a layer of silicon oxynitride. In yet other preferred embodiments, the single spacer layer 138a is a layer of silicon oxynitride with refractive index of 1.55 with thickness of 500 nm. In yet other embodiments, single spacer layer 138a is a layer of silicon oxynitride with thickness in the range of 0 to 1000 nm. Although in preferred embodiments, a spacer layer 138 is included in the structure, in some other embodiments, the spacer layer 138, can be combined with the buffer layer, can be made very thin, or is not included (FIG. 1C).

Spacer layer 138 can be a composite spacer layer 138b of one or more layers of silicon oxynitride or silicon dioxide. In an embodiment, composite spacer layer 138b is includes two layers of silicon oxynitride with thicknesses of 250 nm and with a composite refractive index of approximately 1.55. In some embodiments, the sum of the thicknesses of the two layers in composite spacer layer 138b is in the range of 1 to 1000 nm (FIG. 1C).

Similarly, the spacer layer 138 can be a composite layer 138c of three or more layers with the same or varying thicknesses and refractive indices, that when combined, provide a total thickness in the range of 1 nm to 1000 nm and a composite refractive index in the range of 1.4 to 2.02 (FIG. 1C).

The combined thicknesses of the buffer layer 130 and the spacer layer 138 in embodiments provide spatial separation between the core repeating stack 142 and the substrate 110 and reduce, minimize, or eliminate the interaction of the transmitted optical signal with the substrate 110. The transmission of optical signals with low optical loss through the repeating structure 142 requires some degree of confinement of the signal to the waveguide with minimal interaction of the optical signals with the substrate 110 in embodiments for which the optical signals are attenuated in the substrate material. Silicon and some other semiconductors, and metal layers in the interconnect layers, for example, can lead to significant attenuation of optical signals. The combined thicknesses of the buffer layer 130 and the spacer 138 provide spatial isolation between the substrate materials and the upper layers of the inventive dielectric stack structure to reduce the interaction of transmitted optical signals with materials in the substrate that can lead to attenuation.

Dielectric stack 142 forms the core of the inventive waveguide structure through which optical signals can be transmitted with low optical loss. In preferred embodiments, the dielectric film stack 142 of is a layered structure of silicon oxynitride films.

In an embodiment, the dielectric stack 142 has a repeating stack 142a of two dielectric films in which the constituent films within the repeating stack structure 142a are of differing refractive indices. Differences in the refractive indices can occur primarily from changes in the stoichiometric composition of the films. In preferred embodiments, the changes in the stoichiometry of the films in the repeating film structure 142 is accomplished with changes in the process conditions used in the deposition of the films in the repeating film structure 142. In a preferred embodiment, the repeating stack structure 142a includes a first film 143 of 900 nm of silicon oxynitride with an index of refraction of 1.6 and a second film 144 of 50 nm of silicon oxynitride with an index of refraction of 1.7. In another preferred embodiment, the repeating structure 142a includes a first film 143 of 40 nm of silicon oxynitride with an index of refraction of 1.7 and a second film 144 of 500 nm of silicon oxynitride with an index of refraction of 1.65. In yet another preferred embodiment, the repeating structure 142a includes a first film 143 of 60 nm of silicon oxynitride with an index of refraction of 1.7 and a second film 144 of 500 nm of silicon oxynitride with an index of refraction of 1.65. It is to be understood that the order of the first film 143 and the second film 144 in embodiments can be reversed and remain within the scope and spirit of the invention (FIG. 1B).

In another embodiment, the dielectric stack 142b has a repeating stack 142 of more than two dielectric films in which the constituent films 145-147 within the repeating structure 142a are of differing refractive indices, and in some embodiments, of the same or differing thicknesses. In an embodiment, repeating stack 142b includes a first film 145 of 400 nm of silicon oxynitride with an index of refraction of 1.6, a second film 146 of 500 nm of silicon oxynitride with an index of refraction of 1.65, and a third film 147 of 50 nm of silicon oxynitride with an index of refraction of 1.7 (FIG. 1B).

In yet other embodiments, the repeating stack 142c of dielectric stack 142 includes more than three layers for which the index of refraction for the constituent layers of silicon oxynitride is varied to achieve the total film thickness of the overall dielectric stack structure 142. In embodiments, for example, in which the repeating film structure 142a has two constituent films with a combined thickness of 600 nm, the stack must be repeated 15 times to reach an overall thickness of 9 microns for the dielectric film stack 142. In other embodiments in which the overall thickness of the dielectric film stack is 9 microns, a repeating stack of 45 constituent layers of 100 nm each can be implemented in which the overall repeating structure 142a-142c need only be repeated twice to achieve the overall thickness. In yet other embodiments, the repeating structure 142a-142c of dielectric stack 142 has a layered film structure that does not repeat because the total number of constituent films in the repeating stack provides sufficient overall film thickness for the film structure 142 (FIG. 1B).

In preferred embodiments, the repeating film structure 142 is a composite structure of repeating stacks. In embodiments with the repeating stack 142a, the overall thickness of repeating film structure 142 is the combined thickness of the repeating stack 142a, 142b multiplied by the number of times that the repeating stack 142a-142b is repeated. For example, the repeating film structure 142a for a preferred embodiment in which the first layer 143 is 900 nm and the second layer 144 is 50 nm has a total repeating stack thickness of 950 nm and when repeated 9 times, the resulting combined film thickness for dielectric stack 142 is 8590 nm ((900 nm+50 nm)×9=8590 nm)). Similarly, in another preferred embodiment, the repeating film structure 142a, which has a first layer 143 that is 40 nm with a refractive index of 1.7, and which has a second layer 144 that is 500 nm in thickness with a refractive index of 1.65, has a combined thickness for repeating stack 142 of 540 nm, and when repeated 10 times, has a resulting combined film thickness for dielectric stack 142 of 5400 nm ((500 nm+40 nm)× 10=5400 nm)) (FIG. 1B).

Generally, the overall dielectric stack 142 is made sufficiently thick to provide the low optical loss for optical signals transmitted through the resulting waveguide structure 140. The multilayer structure, deposited at low temperatures, ensures low stress in the resulting film structure and enables thick waveguides (2000 nm to 25000 nm) to be formed. Waveguide structures 140 are thus sufficiently thick to enable transmission of the optical signals with little interaction of the transmitted optical signals with the substrate, interaction levels that could lead to undesired attenuation of the transmitted signals.

It is to be understood that the thickness, the number of films, and the refractive index for the films in dielectric stack 140 can vary and remain within the scope of the current invention. The refractive index of silicon oxynitride films can vary in the range of 1.4 to 2.02. As the concentration of nitrogen in deposited silicon oxynitride films is minimized, the refractive index approaches the index of refraction of silicon dioxide, 1.445. Conversely, as the concentration of oxygen is minimized in the deposited films, the refractive index approaches the index of refraction of silicon nitride, 2.02. The index of refraction can thusly be varied in the range of 1.445 to 2.02 by varying the stoichiometric concentration of silicon, oxygen, and nitrogen in the deposited films. In embodiments, the index of refraction for the constituent films 143, 144 in the repeating dielectric film stack 142a, for example, are varied in the range of 1.445 to 2.02 to produce thick film structures of 2000 to 25000 nm, or greater, and that provide low stress and low optical signal losses, in dielectric film stacks 140.

In another preferred embodiment, the dielectric film stack 142 includes a repeating stack 142a with a first layer 143 of silicon oxynitride with thickness of 60 nm and an index of refraction of 1.7 and a second layer 144 of silicon oxynitride with thickness of 500 nm and an index of refraction of 1.65. Repeating dielectric stack structure 142a is repeated in an embodiment 13 times for a total thickness for dielectric film stack 142 of 7280 nm. It is to be understood that the total number of repeating film stacks 142a can vary. In some preferred embodiments, the number of repeating film stacks 142a is three to twenty. In some other preferred embodiments, the repeating film stack 142a is such to produce a total dielectric film structure 142 that in some embodiments is greater than 2000 nm in thickness and in some embodiments less than 25000 nm. In yet other preferred embodiments, the total dielectric film structure 142 is in the range of 8000 to 12000 nm. In yet other embodiments, the number of repeating film stacks 141 is two or more and the thickness of the dielectric film structure 142 is greater than 2000 nm and less than 25000 nm (FIG. 1B).

In some embodiments, the thickness for the first film 143 is in the range of 5 nm to 1000 nm. In some other embodiments, the thickness of the second film 144 is in the range of 5 nm to 1000 nm. In these and other embodiments, the thickness of the dielectric film structure 142, which is the sum of the thicknesses of the repeating film structures 142a, is greater than 2000 nm in thickness. In preferred embodiments, the thickness of the sum of the repeating film structures 142a is in the range of 4000 to 10000 nm.

It is to be understood that the repeating film structure 142a is an integral component of the inventive dielectric stack structure 140. It is also to be understood that the number of films, the film thicknesses, the refractive indices, and the resulting composition of the films can be varied and remain within the spirit and scope of the inventive dielectric stack structure 140, and in the practice of utilizing the dielectric stack structure 140 to provide low stress and low optical loss for signals transmitted through waveguides that are fabricated from the dielectric stack structure 140. In this regard, in some embodiments, an initial repeating film structure 142a is used for two or more of the films in the dielectric stack 142, and then a different repeating film structure 142a is used for another two or more films in the same dielectric film structure 140 to produce inventive dielectric stack 140. It is to be further understood that an initial repeating film structure 142a can be used for two or more of the films in the dielectric film structure 142, a different repeating film structure 142a, can be used for another two or more films in the same dielectric film structure 142, and then any number of additional repeating film structures 142a with the same or different repeating film structures can be used for two or more additional films in the dielectric film structure 140 and remain within the scope and spirit of the embodiments. In the foregoing discussion, the variations in the first film 143 and second film 144 can be produced with one or more variations in the refractive index, the thickness, and the composition or stoichiometry of the films (FIG. 1B).

It is also to be understood that in some embodiments, first film 143 in the repeating film structure 142a can include one or more films and remain within the scope of the invention. In an embodiment, first film 143 in repeating film structure 142a, for example, is 500 nm in thickness with a refractive index of 1.7. In another embodiment, first film 143 includes a first part that is 250 nm in thickness with a refractive index of 1.7 and a second part that is 250 nm in thickness with a refractive index of 1.65. In yet another embodiment, the first film 143 in the repeating film structure 142a has a refractive index of 1.68 with a first partial thickness that is 250 nm and a second partial thickness that is deposited in a separate process step from the first, for example, and that is also 250 nm in thickness for a combined thickness of 500 nm for the two partial films of the first film 143 of repeating film structure 142a (FIG. 1B).

In some embodiments, the first film 143 has a graded refractive index or stoichiometric composition. Gradations in the composition of the first film 143 of the repeating film structure 142a, for example, remain within the scope of the current invention. In some embodiments, the refractive index varies through part or all of the thickness of the first film 143. Similarly, in some embodiments, the stoichiometric composition varies through part or all of the thickness of the first film 143. Variations in the refractive index or the stoichiometric composition of the first film 143 within the thickness of this film remain within the scope of the current invention (FIG. 1B).

It is also to be understood that in some embodiments, second film 144 in the repeating film structure 142a can include one or more films and remain within the scope of the invention. In an embodiment, second film 144 in repeating film structure 142a, for example, is 500 nm in thickness with a refractive index of 1.7. In another embodiment, second film 144 includes a first part that is 250 nm in thickness with a refractive index of 1.7 and a second part that is 250 nm in thickness with a refractive index of 1.65. In yet another embodiment, the second film 144 in the repeating film structure 142a has a refractive index of 1.68 with a first partial thickness that is 250 nm and a second partial thickness that is deposited in a separate process step from the first, for example, that is also 250 nm for a combined thickness of 500 nm for the two partial films of the second film 144 of the repeating film structure 142a (FIG. 1B).

In some embodiments, the second film 144 has a graded refractive index or stoichiometric composition. Gradations in the composition of the second film 144 of the repeating film structure 142a, for example, remain within the scope of the current invention. In some embodiments, the refractive index varies through part or all of the thickness of the second film 144. Similarly, the stoichiometric composition varies through part or all of the thickness of the second film 144. Variations in the refractive index or the stoichiometric composition of the second film 144 within the thickness of this film remain within the scope of the current invention (FIG. 1B).

In some embodiments, repeating structure 142 has an unequal number of first layers 143 and second layers 144. In some embodiments, repeating structure 142 includes a first layer 143 positioned between two second layers 144 (FIG. 1B).

In preferred embodiments, top spacer layer 150 is one or more layers of silicon dioxide or silicon oxynitride. In some embodiments, single spacer layer 150a is a layer of one type of material, such as silicon dioxide. In some preferred embodiments, single spacer layer 150a is a layer of silicon oxynitride. In yet other preferred embodiments, the single spacer layer 150a is a layer of silicon oxynitride with refractive index of 1.55 and with a thickness of 500 nm. In yet other embodiments, single spacer layer 150a is a layer of silicon oxynitride with thickness in the range of 0 to 1000 nm. Although in preferred embodiments, a spacer layer 150a is included in the structure, in some other embodiments, the spacer layer 150 can be combined with an optional top layer, can be made very thin, or is not included (FIG. 1A).

Spacer layer 150 can be a composite spacer layer 150b of one or more layers of silicon oxynitride or silicon dioxide. In an embodiment, composite spacer layer 150b includes two layers of silicon oxynitride with thicknesses of 250 nm and with a composite refractive index of approximately 1.55. In some embodiments, the sum of the thicknesses of the two layers in composite spacer layer 150b is in the range of 1 to 1000 nm (FIG. 1A).

Similarly, the spacer layer 150 can be a composite layer 150c of three or more layers with the same or different thicknesses and refractive indices, that when combined, provide a total thickness in the range of 1 nm to 1000 nm and a composite refractive index in the range of 1.4 to 2.02 (FIG. 1A).

Optional top layer 158 is one or more layers of a dielectric material such as silicon dioxide, silicon nitride, aluminum oxide, and aluminum nitride, among others. In some embodiments, a top layer 158 of silicon dioxide with thickness of 200 nm and a refractive index of 1.445 is used. In some embodiments, the film thickness of the top layer is in the range of 0 to 500 nm. In some embodiments, silicon oxynitride is used in the optional top layer 158. In some embodiments, another dielectric material or combination of materials such as aluminum nitride or aluminum oxide is used. In some embodiments, no optional top layer 158 is provided.

Figure 2B:
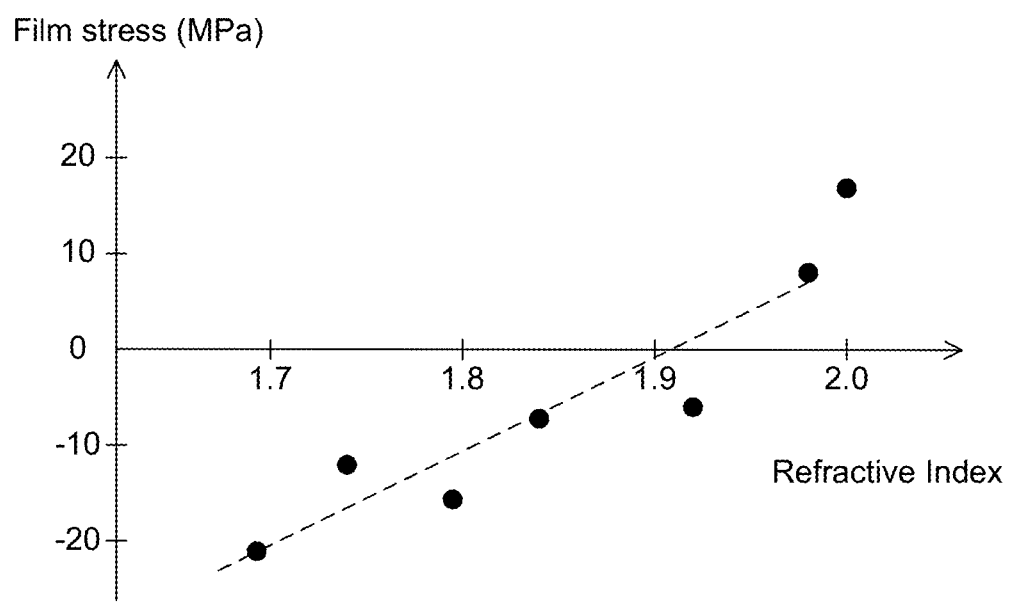

The advantages of the current invention with regard to achievable ranges of the measured film stress for films that can be implements in fabricating dielectric film structures are shown in FIG. 2 for some embodiments. In FIG. 2A, the measured film stress is shown for a range of thicknesses for the inventive dielectric film stacks. FIG. 2A shows that the film stress can be controlled to less than approximately 20 MPa for embodiments as thick as approximately 18 um. These relatively low stress levels are not achievable or very difficult to achieve in films of a single thick layer of material such as silicon dioxide or silicon oxynitride. In FIG. 2B, the measured stress levels for deposited silicon oxynitride films are shown for films of various refractive indices. As shown, the refractive index is a convenient means for assessing variations in film properties for deposited films. The capability to achieve control of the stress in the individual films over a wide range, allows for the fabrication of very thick dielectric film structures (1000-25000 nm, and greater) with optical properties that are suitable for use as planar waveguides. In embodiments, stress levels are controlled in planar waveguide structures to minimize deformation of the substrates upon which the thick dielectric stacks are deposited, and to achieve low optical signal loss in waveguides fabricated from these thick dielectric film structures.

Figure 3A:
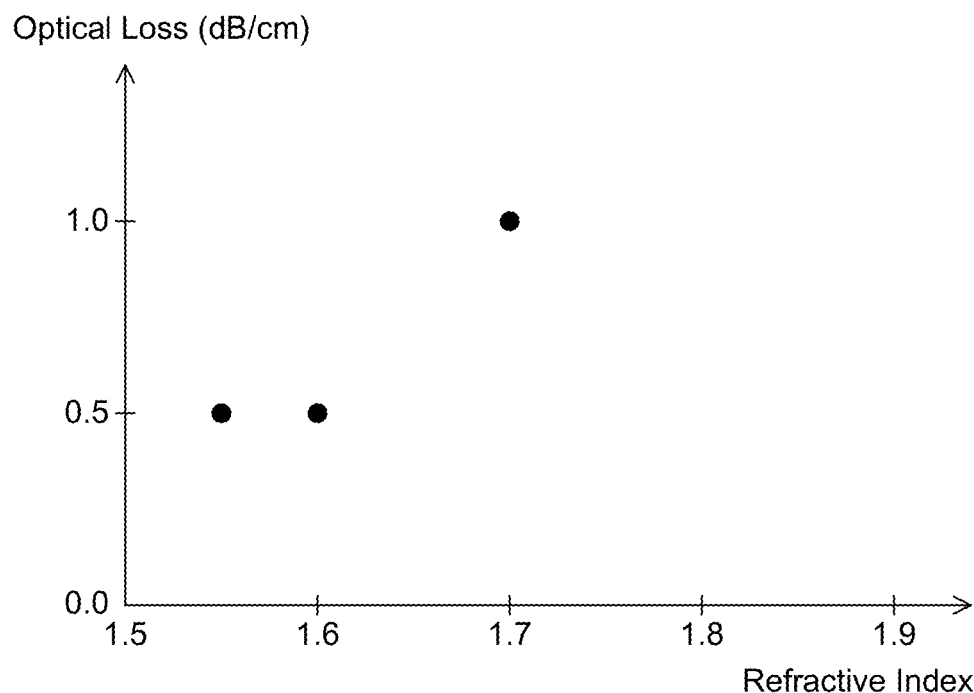
FIG. 3A-3B show measured optical losses in accordance with embodiments for FIG. 3A dielectric films of various refractive indexes and FIG. 3B dielectric waveguide film structures with various bottom buffer layer film thicknesses.
Figure 3B:
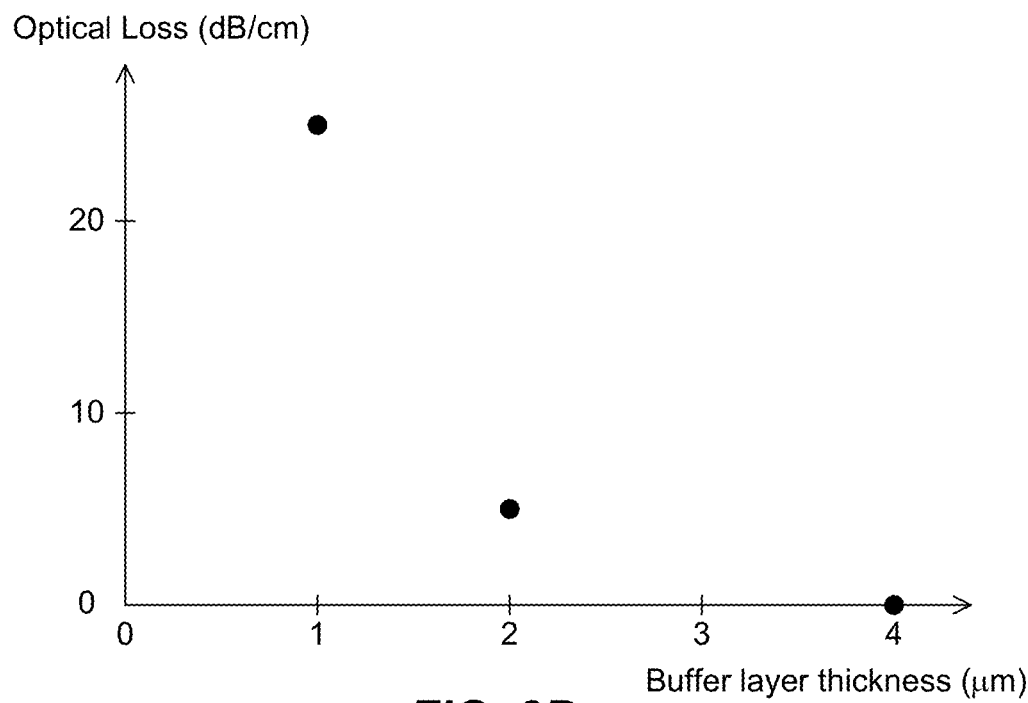

Referring to FIG. 3, the measured optical losses from some embodiments of the inventive dielectric stack structures are shown. Optical signal losses for practical use in planar waveguide structures of less than approximately 1 dB/cm are desirable. FIG. 3A shows that these levels are achievable for a range of measured composite refractive indices from the inventive dielectric stack structures. In addition to the properties of the dielectric stack structure itself, the buffer layer also has an influence on the measured losses for optical signals transmitted through waveguides fabricated from the inventive dielectric stack structures. FIG. 3B shows how the thickness of the buffer layer in some embodiments affects the measured optical losses. As the thickness of the buffer layer is increased in these embodiments, the resulting optical losses are reduced to values of much less than 1 dB/cm.

Referring to FIG. 4, steps in the formation of embodiments of the dielectric films and film structures are provided. In FIG. 4A, forming step 400 in the process of forming embodiments of the inventive dielectric stack 140 of silicon oxynitride films at low temperature having low stress and low optical loss is shown. Low temperature in FIG. 4A refers to the temperature of the deposition of the films used in the fabrication of the dielectric stacks, namely less than 500° C. in some embodiments, and in other embodiments, less than or equal to 300° C. Low stress in FIG. 4A refers to stress levels in the deposited films in film structure 140 of less than or equal to approximately 20 MPa, either compressive or tensile. Low optical loss in FIG. 4A refers to optical losses in embodiments of deposited dielectric film stacks 140 of less than approximately 1 dB/cm. The forming step 400 provides for the formation of thick structures of dielectric silicon oxynitride films with low stress, and suitable for use in the transmission of optical signals with low loss.

Referring to FIG. 4B, the forming steps 420 in embodiments for which each individual layer in the inventive dielectric stack 140 of silicon oxynitride films is deposited at low temperature, and with low stress and low optical loss is shown. Low temperature in FIG. 4B refers to the temperature of the deposition of the films used in the fabrication of the dielectric stacks, namely less than 500° C. in some embodiments, and in other embodiments, less than or equal to 300° C. Low stress in FIG. 4B refers to stress levels in the deposited films of less than or equal to approximately 20 MPa, either compressive or tensile. Stress levels of less than 20 MPa in deposited films ensure minimal substrate deformation and reduce the likelihood that the films will delaminate. Low optical loss in FIG. 4B refers to optical losses in embodiments of deposited dielectric film stacks 140 of less than approximately 1 dB/cm. Forming step 420 provides for the formation of thin composite films of dielectric silicon oxynitride deposited sequentially at low temperatures of less than 500° C. to form the thick dielectric stack structures 140 with low stress, and suitable for use in the transmission of optical signals with low loss.

Referring to FIG. 4C, steps in the formation of planar waveguides from a forming step 440 and a patterning step 450 are shown for some embodiments. Formation of the individual dielectric films and the dielectric film structures 440 for the inventive stack structure 140 are shown that include the formation of a dielectric stack of silicon oxynitride films on a substrate 110 with a stack structure that includes a buffer layer 130, one or more optional bottom spacer layers 138, a repeating stack of one or more dielectric layers 142, one or more optional top spacer layers 150, and an optional top layer 158. Embodiments for the forming of the dielectric film and film structures 440 utilize one or more of forming step 400 and forming step 420. Patterning step 450 is combined in embodiments with forming step 440 on the resulting dielectric stack to form one or more planar waveguides from the dielectric stack structures 140. Patterning steps can include the use of established photoresist patterning processes, in which photosensitive layers are used either directly as a means for transferring a pattern with subsequent dry or wet etch processing, or via a hard mask in which the photoresist is first used to transfer a pattern to a hard mask layer that is then used to transfer the waveguide pattern from the hard mask layer to the dielectric stack layer. Processes for photoresist patterning and subsequent wet and dry etching of film structures are well established for those skilled in the art of dielectric film patterning techniques.

Typical deposition processes for dielectric films used in semiconductor device manufacturing include chemical vapor deposition (CVD), plasma enhanced chemical vapor deposition (PECVD), metalorganic chemical vapor deposition (MOCVD), physical vapor deposition (PVD), atomic layer deposition (ALD), among others.

In embodiments, deposition of the inventive dielectric film structure 140 is accomplished using PECVD. In other embodiments, deposition of the inventive dielectric film structure 140 is accomplished using one or more of the thin film deposition techniques that include chemical vapor deposition (CVD), plasma enhanced chemical vapor deposition (PECVD), metalorganic chemical vapor deposition (MOCVD), physical vapor deposition (PVD), and atomic layer deposition (ALD).

Process parameters such as the process pressure, substrate temperature, and process power levels, as well as the selection of precursor gases and the flows of these and other gases used in the process, among others, can each affect the resulting properties of the deposited films. In the fabrication of nitrogen-containing films such as silicon nitride and silicon oxynitride, for example, precursors such as ammonia gas ($NH_3$), a source of nitrogen, and silane ($SiH_4$), a source of silicon, are combined in a plasma environment to facilitate the formation of the thin silicon nitride films. The ammonia and silane can be further combined with one or more oxidizing gases such as oxygen ($O_2$), nitric oxide (NO), and nitrous oxide ($N_2O$) to incorporate oxygen into the growing films to form silicon oxynitride. The properties of the silicon nitride and the silicon oxynitride films can be affected by the specific selection of gases in the process mixture and the ratio of the specific gas flows in the mixture. Residual impurities, such as hydrogen, can also affect the properties of the deposited films, particularly through the formation of nitrogen-hydrogen bonds in the deposited films. In embodiments, a process is provided to fabricate dielectric film structure 140 in which one or more nitrogen precursors that do not contain hydrogen are used in the formation of thin films of silicon nitride and silicon oxynitride to reduce the residual hydrogen concentration in the deposited films.

Figure 5:
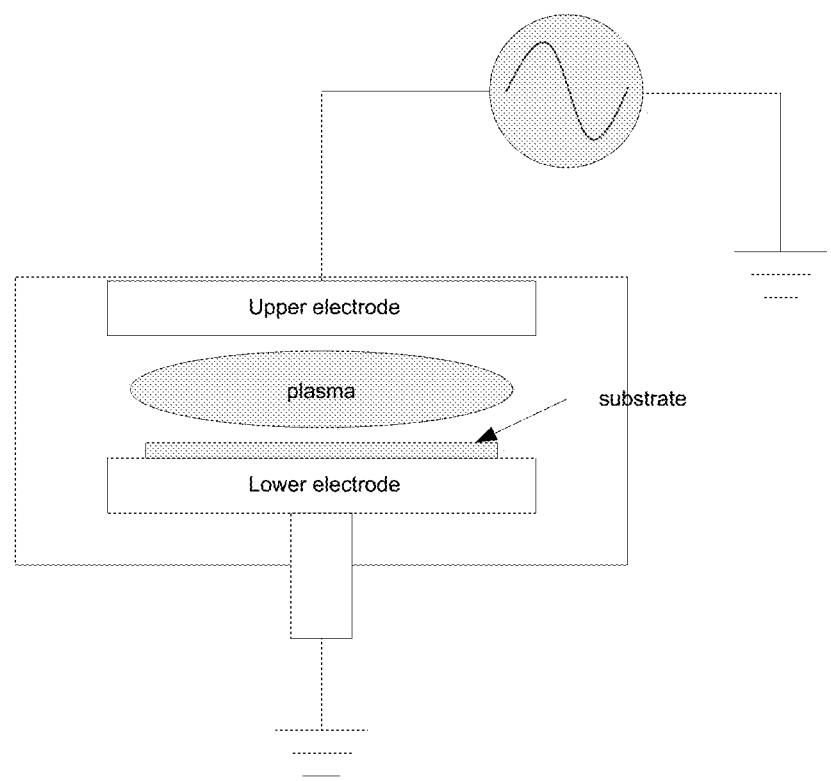
FIG. 5 shows a schematic of a typical plasma enhanced chemical vapor deposition system.

In embodiments, plasma enhanced chemical vapor deposition (PECVD), as shown for example in the schematic drawing in FIG. 5, is used to deposit silicon oxynitride film structures 140. PECVD processes are most typically performed under vacuum conditions with precursor gases specific to the types of films that are targeted for deposition. Substrates are most typically heated to elevated temperatures. In the configuration shown in FIG. 5, radio frequency (rf) power is capacitively coupled to the electrode opposite to that on which the substrate resides during the process. In the PECVD system depicted in FIG. 5, substrates reside on the lower electrode during processing, and the rf power is applied to the upper electrode. In embodiments in which the power is applied to the upper electrode, the substrate is not subjected directly to high energy ion bombardment as would be anticipated if the substrate were to be placed on the rf powered electrode.

In an embodiment of the present invention, multilayer dielectric film structure 140 is formed using PECVD technology with a process chemistry that utilizes hydrogen-free nitrogen and oxygen precursors to yield planar waveguides with low optical loss and low stress. PECVD technology is widely used in semiconductor and optical device fabrication. Much of the equipment used in the manufacturing of semiconductor devices can be used in the fabrication of optical devices and the use of the term "semiconductor device fabrication" herein is intended to include optical device fabrication. The fabrication of the optical devices and optical subassemblies, utilize, or have the potential to utilize, the techniques and practices used in semiconductor device fabrication.

In embodiments, the dielectric film stack 140 is deposited onto a substrate using PECVD technology at temperatures in the range of 200-500° C. In other embodiments, the substrate temperature during deposition of the dielectric film structure 140 is in the range of approximately 250-400° C. In yet other embodiments, the dielectric film stack 140 is deposited onto a substrate using PECVD technology at temperatures of approximately 300° C. And in yet another embodiment, the dielectric film stack 140 is deposited at or approximately 300° C. using a gas mixture of silane, nitrogen, and nitrous oxide. In yet another embodiment, the dielectric film stack is deposited using a gas mixture of silane, nitrogen, and oxygen. In yet another embodiment, the dielectric film stack 140 is deposited at or approximately 300° C. using a gas mixture of silane, nitrogen, and nitric oxide.

In general, a gas mixture used in the deposition of silicon oxynitride films must contain at least the primary stoichiometric constituents or elements of the film, namely, silicon, oxygen, and nitrogen. Control of the deposited dielectric film properties is achieved, in part, with the control of the gas flows and mixture ratios of the constituent precursor gases in the deposition system. In an embodiment, for example, silane gas ($SiH_4$) is used as a precursor to provide the silicon, nitrogen gas ($N_2$) is used as a precursor for nitrogen, and oxygen gas ($O_2$) is used as a precursor for oxygen. In embodiments, the independent control of one or more of the gas flows, the ratios of the gases, and the partial pressures of these three gases in the deposition system can provide a means for independent control of the ratio of the three elements, namely Si, N, and O, in the deposited films.

In embodiments, silane gas, one of the most commonly used precursors for the deposition of silicon and silicon-containing thin films in epitaxial and chemical vapor deposition processes in semiconductor device fabrication, is provided as a source for silicon in the deposited film structure 140. In other embodiments, one or more of a silicon precursor that includes dichlorosilane, trichlorosilane, methylsilane, silicon tetrachloride, chlorosilane, dichlorosilane, and trichlorosilane is utilized as a silicon precursor in the deposited dielectric film structure 140.

In embodiments, a silicon-containing precursor gas that may or may not contain hydrogen, is combined with a hydrogen-free precursor gas for nitrogen, and a hydrogen-free precursor gas for oxygen to produce the oxynitride layers in the dielectric stack structure 140. In other embodiments, silane ($SiH_4$) is used as the silicon precursor in the PECVD deposition of silicon oxynitride films. In yet other embodiments, silane is used as the silicon precursor and is mixed with hydrogen-free precursors for nitrogen and oxygen to form films of silicon oxynitride.

In addition to the source of silicon in one or more of the precursors in the deposition gas mixture, precursors for embodiments with silicon oxynitride in the dielectric film structure 140 include one or more of an oxygen-containing precursor, a nitrogen-containing precursor, and a precursor that contains both oxygen and nitrogen. Precursors that contain both oxygen and nitrogen elements in embodiments include nitrous oxide, nitric oxide, nitrogen dioxide, dinitrogen tetraoxide, and mixtures of these gases, for example.

In other embodiments, a nitrogen-containing precursor that does not contain oxygen is used in combination with an oxygen-containing precursor that does not contain nitrogen. In an embodiment, nitrogen gas ($N_2$) is the nitrogen-containing precursor and is combined with oxygen gas ($O_2$) as the oxygen-containing precursor, and further combined with silane or another silicon-containing precursor described herein in a plasma enhanced chemical vapor deposition system. In yet other embodiments, a nitrogen-containing precursor such as nitrogen gas is combined with one or more precursors that contain both oxygen and nitrogen, such as nitrous oxide and nitric oxide, or a mixture thereof, and further combined with silane or another silicon-containing precursor as described herein in a plasma enhanced chemical vapor deposition system to form the silicon oxynitride layers in dielectric stack 140. In yet other embodiments, an oxygen-containing precursor such as oxygen gas is combined with one or more precursors that contain both oxygen and nitrogen, such as nitrous oxide and nitric oxide, and further combined with silane or another silicon-containing precursor in a plasma enhanced chemical vapor deposition system or other deposition system as described herein to form dielectric stack 140. Oxygen-containing precursors include atomic oxygen, molecular oxygen, ozone, carbon monoxide, and carbon dioxide.

And in yet other embodiments, one or more of argon, helium, neon, xenon, nitrogen, and oxygen is added to the gas mixtures described herein in embodiments as a diluent. Diluents are often utilized in semiconductor deposition processes to slow the deposition rate, to enhance the ignition of the plasma in plasma-based processes, to improve deposition uniformity, and to alter or modify the energy absorption profile of the gaseous species in the plasma, among other potential benefits. Addition of one or more diluents listed herein to the processes described herein remains within the scope of the current invention.

In embodiments, the use of hydrogen-free, nitrogen and oxygen precursors in the deposition of the inventive dielectric film stacks yields low stress silicon oxynitride film structures from which waveguides can be formed that exhibit low optical signal loss.

In other embodiments, low stress, low optical loss silicon oxynitride film structures are formed using plasma enhanced chemical vapor deposition with a gas mixture that contains one or more of each of a silicon-containing precursor, a nitrogen-containing precursor, and an oxygen-containing precursor.

Figure 6:
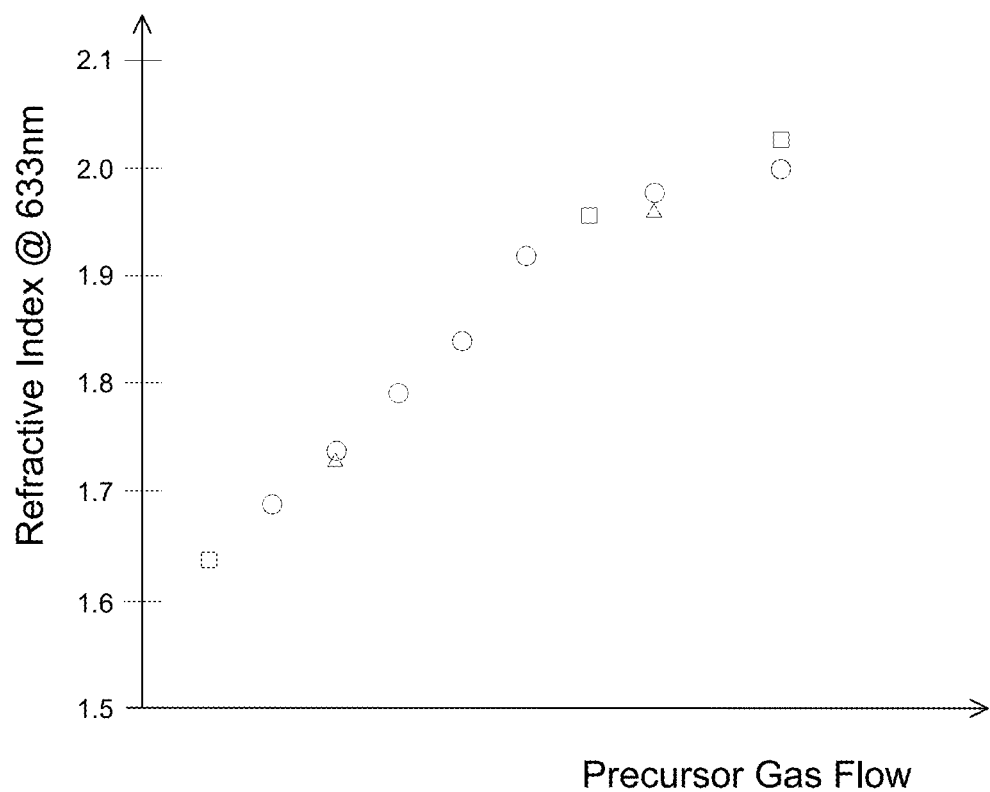
FIG. 6 shows the measured refractive index for waveguide structures that were deposited over a range of the silicon-containing precursor gas flow.

Referring to FIG. 6, a plot of the refractive index is shown for silicon oxynitride films deposited using such a gas mixture in a PECVD system. The ordinate in the plot in FIG. 6 shows the flow rate of a molecular precursor gas that contains silicon and the abscissa shows the refractive indices for a measurement wavelength of 633 nm that correspond to specific values of the precursor gas flow rate used in the deposition of the inventive dielectric stack structures 140. The plot includes sample data that show the variation in a representative optical property, namely the refractive index, for silicon oxynitride films that were deposited over a range of gas flows for the silicon-containing precursor, holding other gas flows and PECVD system parameters constant.

The data provided in FIG. 6, when combined with the measured stresses over a similar range of refractive indices as provided in FIG. 2B, demonstrate the benefits of the inventive process as a means to provide control of the optical properties (refractive index) and mechanical properties (stress) of the deposited films with variation of the gas flow mixture. The range of gas mixtures shown in the exemplary sample data shown in FIG. 6, produced with variations in the silicon-containing precursor gas flow, provide a wide range of measured refractive indices for silicon oxynitride films. The variation in the measured refractive index are shown in FIG. 2B to produce the low values of residual stress in deposited silicon oxynitride films, and that a crossover point of zero stress can be produced a specific value of the silicon-containing precursor gas flow. The innovation provided using the inventive processes should become increasingly apparent in embodiments in which the achievable optical and mechanical properties are further combined with the inventive superlattice stack structures described herein for the dielectric stack structures 140 as described in FIG. 1. Combinations of refractive index and film thickness yield stack structures in embodiments that have low stress and low optical loss when deposited with processes that do not contain hydrogen in the nitrogen and oxygen precursors.

In embodiments of the inventive PECVD processes, a dielectric stack structure 140 is provided on substrate 100 wherein the ratios of the precursor gases in the PECVD process are configured to achieve a stress level of less than approximately 20 MPa in magnitude. In other embodiments, the dielectric stack structure 140 is a structure of silicon oxynitride layers deposited in a PECVD system using a process that contains silane, nitrogen, and nitrous oxide wherein the ratios of these precursor gases are configured to achieve a stress level that is less than or approximately 20 MPa. In embodiments, control of the stress is achieved with the ratios of the gases in combination with the film thicknesses of the individual layers in the dielectric film structure 140, as described in examples provided herein.

In embodiments of the dielectric stack structures 140, for example, the stoichiometric concentrations of the individual layers are selected, as reflected in the measured refractive index of the individual layers in the stack structure, and optimized along with the layer thicknesses to produce low stress film structures with low optical signal loss characteristics. In the formation of the stacked dielectric structure 140, the total composite refractive index and the stress level in the film stack 140 are affected by the number of layers, the characteristics of the interfaces between the layers, the stoichiometric concentration, the resulting density of the deposited films, and the presence of impurities in the deposited films. This suggests that the measured refractive index may not be unique. Although the refractive index provides an effective method for characterizing the effect of changes in process parameters such as the gas flow on the optical properties of the deposited dielectric films, multiple stoichiometric concentrations may exist for the elemental constituents of the silicon oxynitride layer for a given value of refractive index. Nonetheless, the refractive index is an effective means for providing a measure of changes in the film properties, and most notably, a measure of the residual stress in the deposited films.

The data shown in FIG. 6 is provided for demonstrative purposes in that the process parameters such as plasma power, gas pressure, substrate temperature, and gas ratios in the PECVD system can influence the measured refractive index. The effects of the variation in the refractive index are likely a reflection of the variation in the stoichiometric concentrations and perhaps the density of the deposited films. It is important to note, therefore, that the refractive index may not be unique to a single stoichiometric combination of silicon, oxygen, and nitrogen in the silicon oxynitride layers.

Variations in the embodiments in which the inventive dielectric stack structure 140 is combined with the silicon, oxygen, and nitrogen precursors as described herein remain within the scope of the current invention.

In embodiments, the low stress, low optical loss dielectric film structures 140 are formed using plasma enhanced chemical vapor deposition with a gas mixture that does not include hydrogen-containing precursors for either nitrogen, oxygen, or both, or that includes concentrations of these gases that are low enough so as to not require high temperature processing of greater than 500° C. for example, or high thermal budget processes, to achieve the low optical signal losses of less than 1 dB/cm in waveguides fabricated from the inventive dielectric stack structure 140. In some embodiments, a small amount of hydrogen-containing nitrogen or oxygen precursor gas, or both, of approximately 5-10% or less of the total precursor gas flow, is added to the PECVD gas mixture. In these embodiments, the concentrations of hydrogen-containing nitrogen and oxygen precursors are low enough so as to not require high thermal budget processes to achieve the low optical signal losses of less than 1 dB/cm in waveguides fabricated from the inventive dielectric stack structure 140. In yet other embodiments, a nitrogen-containing precursor such as nitrogen gas is combined with a small amount of a hydrogen-containing precursor gas, such as ammonia, for example, and one or more precursors that contain both oxygen and nitrogen, such as nitrous oxide and nitric oxide, and further combined with silane or another silicon-containing precursor as described herein in a plasma enhanced chemical vapor deposition system to form the silicon oxynitride layers in the dielectric stack 140. In these embodiments, the amount of ammonia in the process should be sufficiently low, less than approximately 10% of the total gas flow for example, so as to not require high temperature processing of greater than 500° C. for example, or processing with high thermal budget processes, to achieve the low optical signal losses of less than 1 dB/cm in waveguides fabricated from the inventive dielectric stack structure 140. Although increases in the optical signal loss are to be expected, the inclusion of small amounts of ammonia to the gas mixture will increase the deposition rate of the silicon oxynitride films.

FIG. 2B shows the variation in the measured stress levels in deposited silicon oxynitride films over a range of measured refractive index for these films. The data in FIG. 2B show that the stress in the deposited films using the inventive process can be varied over a wide range between compressive stress and tensile stress with the crossover at 0MPa in the measured stress observed at the transition between the films being in tension and compression. In embodiments, the stress in each layer in the inventive stack structures is varied such that the total stress in the dielectric film structure as shown in FIG. 1 is less than approximately 20 MPa. The stresses in each of the layers of the inventive stack structure as described in FIG. 1, is controlled in embodiments by varying the gas ratio, as for example as shown in FIG. 2B, and by varying the corresponding thickness of the layers. Examples of combinations of specific refractive indices, produced with variations in the nitrogen to nitrous oxide gas ratio, are described herein.

In embodiments, when the use of hydrogen-free nitrogen and oxygen precursors is combined in the deposition chemistry with substrate temperatures during deposition of less than 400° C. in embodiments, and of approximately 300° C. in yet other embodiments, the resulting film stacks can be produced that exhibit stress levels of less than 20 MPa. Additionally, in embodiments, the inventive film stacks are patterned to form optical waveguides that provide low losses for optical signals traveling within these waveguides.

Examples of embodiments of the deposited dielectric film stacks are described herein, and in particular are described in the relevant discussion of FIG. 1 described herein.

In embodiments, the stack of silicon oxynitride films is formed onto a substrate using a PECVD process for which the process parameters, including the precursor gas ratios, are configured to achieve a stress level of less than 25 MPa, and in preferred embodiments less than 20 MPa. Measured stress levels in the deposited film stacks of less than 20 MPa greatly reduce the potential for either the substrate to deform, the deposited films to delaminate, or for some other undesired effect to manifest in either the waveguide or the finished subassembly that includes the waveguide. Substrate deformation and film delamination are just two forms of damage that can occur when stresses in the deposited film structures are not properly controlled. In embodiments, the deposited dielectric film stacks with stress levels of less than 20 MPa are patterned into one or more of waveguides and optical devices.

In yet other embodiments, a stack of silicon oxynitride films are formed onto a substrate using a PECVD process for which the gas ratios are configured to achieve a stress level of less than 20 MPa and for which the process chemistry includes a silicon-containing precursor that may or may not contain hydrogen, and one or more molecular precursors that contain nitrogen or oxygen elements that contains little or no ammonia or other hydrogen-containing gas. In embodiments, the deposited film stacks with stress levels of less than 20 MPa that are deposited using non-hydrogen-containing nitrogen and oxygen gas sources are patterned into one or more of waveguides and optical devices.

In yet other embodiments, a stack of silicon oxynitride films are formed onto a substrate using a PECVD process for which the gas ratios are configured to achieve a stress level of less than 20 MPa and for which the process chemistry does not include ammonia or other hydrogen-containing gas, other than silane. Silane ($SiH_4$) is widely used in industry for the deposition of silicon-containing films and is used in some embodiments. In embodiments, the deposited film stacks with stress levels of less than 20 MPa, that are deposited using non-hydrogen-containing nitrogen and oxygen gas sources such as nitrogen, oxygen, nitric oxide, and nitrous oxide, for example, are patterned into one or more of waveguides and optical devices.

In embodiments, the gas pressure in the PECVD system during the deposition of the silicon oxynitride films can be in the range of 1 mT to 100 Torr to produce dielectric film stack structures. In other embodiments, process pressures are in the range of 50 mTorr to 2 Torr. In yet other embodiments, process pressures are in the range of 100 to 5000 mTorr. The process pressure need not be the same for every step in the deposition sequence required to produce the full dielectric film structure 140.

In embodiments, the total gas flows during deposition of inventive dielectric stack structure 140 used in the inventive dielectric interposers can vary in the range of 5 sccm to 5000 sccm. In some embodiments, the silane gas flow is in the range of 5-1000 sccm. In other embodiments, the silane gas flow, or other silicon-containing precursor gas, is in the range of approximately 10-100 sccm.

In embodiments, the nitrogen and oxygen precursor gas flows can vary over a wide range. In some embodiments, the nitrogen and oxygen precursor gas flows are in the range of 0 to 5000 sccm.

In some embodiments, for which nitrogen is combined with nitrous oxide or nitric oxide, the nitrogen gas flow and nitrous oxide gas flows are in the range of 0 to 5000 sccm.

And in some other embodiments, for which oxygen is combined with nitrous oxide or nitric oxide, the oxygen gas flow and nitrous oxide gas flows are in the range of 0 to 5000 sccm.

In a PECVD system, the input power to the plasma can vary over a wide range. Typical input power for the dielectric stacks in embodiments is approximately 25-2000 W. In some embodiments, the input power during plasma enhanced deposition steps is in the range of 200 to 700 W. In yet other embodiments, the input power during plasma enhanced deposition steps is in the range of 500 to 1200 W. The process power need not be kept constant for the deposition of each of the films in the dielectric stack structure 140 but can vary from step to step, or within a deposition step.

In embodiments, one or more frequencies in the range of 1 kHz to 1 GHz can be used for the rf power provided to the plasma. In an embodiment, a frequency of 13.56 MHz is used to generate the plasma. In other embodiments, other frequencies or combinations of frequencies are used to generate the plasma. In some other embodiments, rf power with a frequency of approximately 27 MHz is applied to the powered electrode. In a preferred embodiment, 13.56 MHz rf power is applied to the upper electrode with the substrate residing on a grounded electrode during the deposition of the dielectric film structure 140. In other embodiments, the electrode upon which the substrate resides during the deposition process is not grounded. In yet other embodiments, the power is applied to both the upper and lower electrodes, divided either equally or unequally.

Power can be delivered to the PECVD system in either capacitive or inductive operational modes and remain within the scope of the current invention. For inductive-coupled PECVD systems, the plasma is typically generated with power that is delivered to the plasma via an antenna and the wafer typically resides on a bottom electrode similar to that shown in the capacitively coupled configuration shown in FIG. 5.

Inert gases, such as argon and helium, can be added to the gas mixture, to yield dielectric film stacks with similar properties and remain within the scope of the current invention. Inert gases are frequently added to deposition process chemistries to modify film properties, such as the stoichiometry or density of the film. In embodiments, argon is added to a gas mixture of silane, nitrous oxide, and nitrogen. In yet other embodiments, helium is added to the gas mixture of silane, nitrous oxide, and nitrogen. In yet other embodiments, one or more of argon and helium is added to a process gas mixture that includes a silicon-containing precursor gas that may or may not contain hydrogen, a nitrogen precursor that does not include hydrogen in the nitrogen-containing precursor gas molecule or molecules, and an oxygen precursor gas that does not contain hydrogen in the oxygen-containing precursor gas molecule or molecules. Examples of nitrogen precursors that do not include hydrogen include molecular nitrogen ($N_2$), nitrous oxide ($N_2O$), and nitric oxide (NO). Examples of oxygen precursors that do not include hydrogen include molecular oxygen ($O_2$), nitrous oxide ($N_2O$), nitric oxide (NO), carbon monoxide (CO), and carbon dioxide ($CO_2$).

Commercially available deposition systems such as the APM PECVD model manufactured by SPTS provide advanced programmability for the deposition of the overall dielectric film structure 140 and for each step in the deposition process. The programmability of commercially available deposition systems enables automated operation of the system hardware that includes, for example, the mass flow controllers, the source power supply or supplies, the temperature controllers, and the pressure controllers. The process parameters such as, for example, the gas flow rates, the power level or levels, the pressure, the substrate temperature, among other parameters for each step in the deposition of a film structure can be programmed into a process recipe. Use of programmable and commercially available deposition systems is widely used in the industry and the use of programmable deposition systems is anticipated and with the scope of the current invention.

Figure 7A:
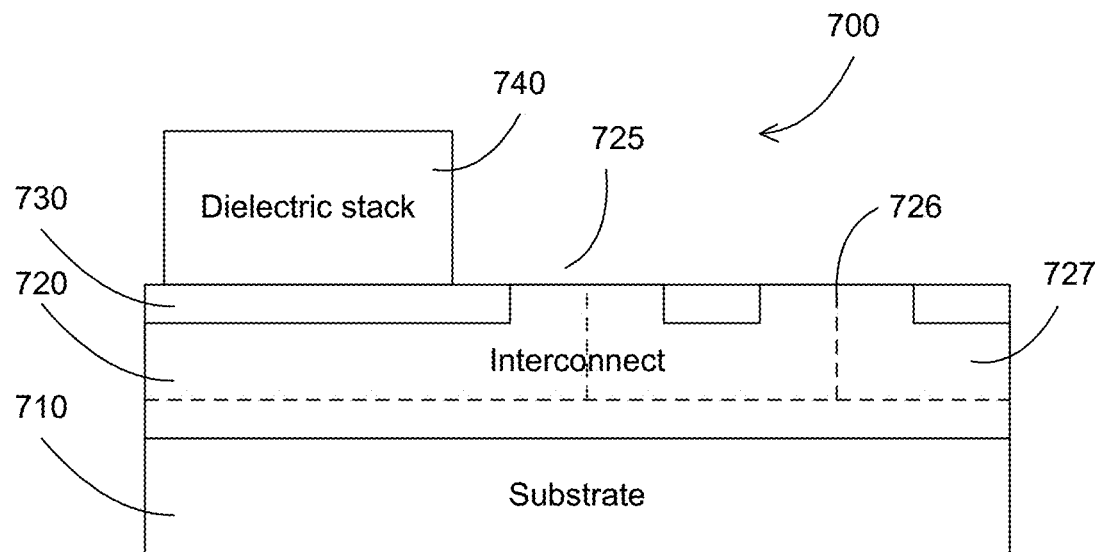
FIG. 7A-7B show cross sectional schematic views of embodiments of an integrated planar waveguide on a substrate.

Referring to FIG. 7A, a cross sectional schematic of an embodiment of the inventive optical dielectric interposer structure 500 is shown. In this figure, an embodiment for interposer 700 includes substrate 710, optional interconnect layer 720, and planar dielectric stack structure 740 disposed on the optional interconnect layer 720. Terminal pad opening 725 in the interconnect layer 720 provides for connections of optical die to the interconnect metal lines. In some embodiments, the top intermetal dielectric 727 in the interconnect layer resides below the dielectric stack 740 as shown in FIG. 7A. The interconnect layer 720 is a structure of metal lines 726 and intermetal dielectric films 727 that provide metal traces for mounting optical devices and for interconnecting electrical and optoelectrical die on the dielectric interposer 700. In some embodiments, the top layer of the interconnect layer 720 may be electrically conductive or insulating, or may be electrically conducting in some areas and insulating in some areas. In preferred embodiments in which optical, electrical, or optoelectrical die are mounted onto the interposer 700, metal traces are routed within the interconnect layer 720 that are accessible through openings 725 to provide electrical and mechanical connections for the optical, electrical, and optoelectrical devices in, on, or connected to the interposer 700. It is to be understood that the mounting of purely optical die (i.e., die that have an optical function but that are not electrical) as in a discrete waveguide for example, can benefit from the methods of mechanical attachment commonly used in the attachment of electrical die. Attachment of purely optical devices using electrical bond pads is within the scope of the current invention as described herein. It is also important to note that the top layer of the intermetal dielectric 727 can provide the same functionality as the buffer layer 730 in some embodiments as shown in FIG. 7A.

Figure 7B:
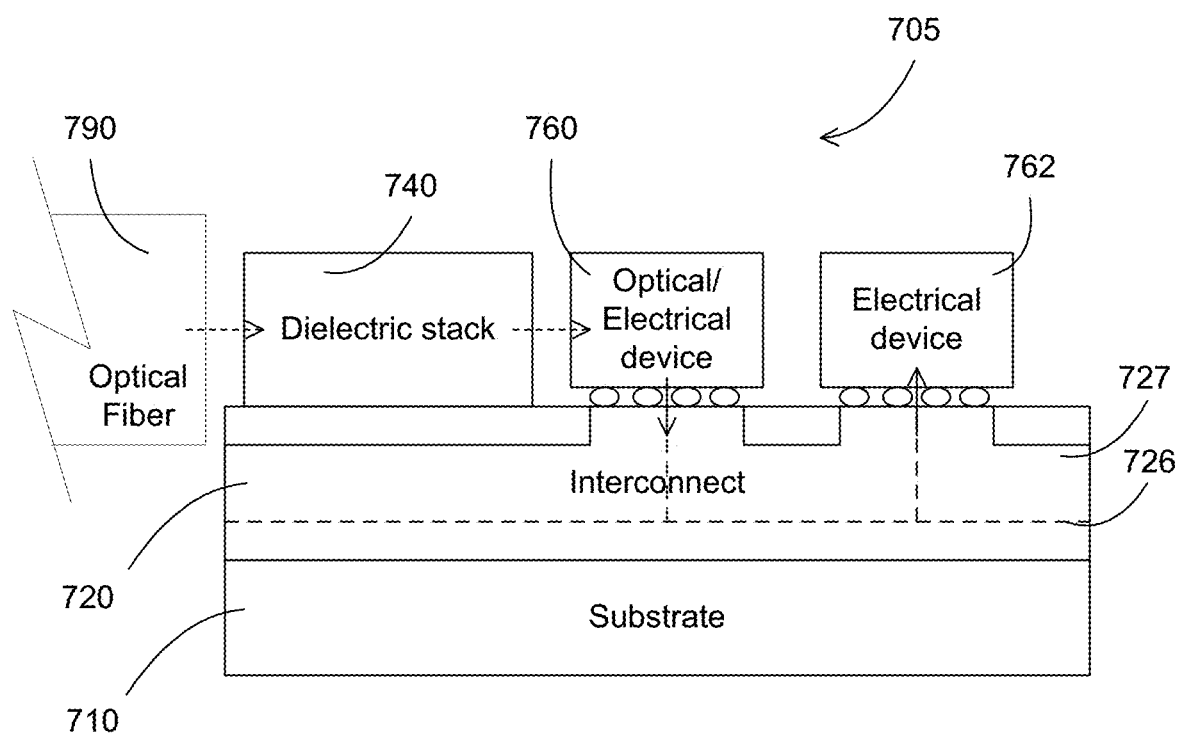

The inclusion of optical, electrical, and/or optoelectrical devices, forms a submount assembly 705 from the inventive optical dielectric interposer 700. FIG. 7B shows a cross sectional schematic of an embodiment of a submount assembly 705 with an optical fiber 790 positioned to provide an optical pathway for the transmission of optical signals between the optical fiber 790 and the planar dielectric stack 740. FIG. 7B also shows optical, electrical, or optoelectrical device 760 and electrical device 762 mounted to terminal pad openings 725 in interconnect layer 720. In an embodiment, optical signals are received from optical fiber 790 into a waveguide fabricated from the planar dielectric stack 740 and routed to device 760 for processing, re-routing, or conversion to electrical signals, for example.

In other embodiments, the optical signals originate on the submount assembly 705 and are transmitted through waveguides fabricated from planar dielectric stack structure 740 to the optical fiber 790. In yet other embodiments, the signals are both received from, and transmitted to, the optical fiber 790.

Figure 8A:
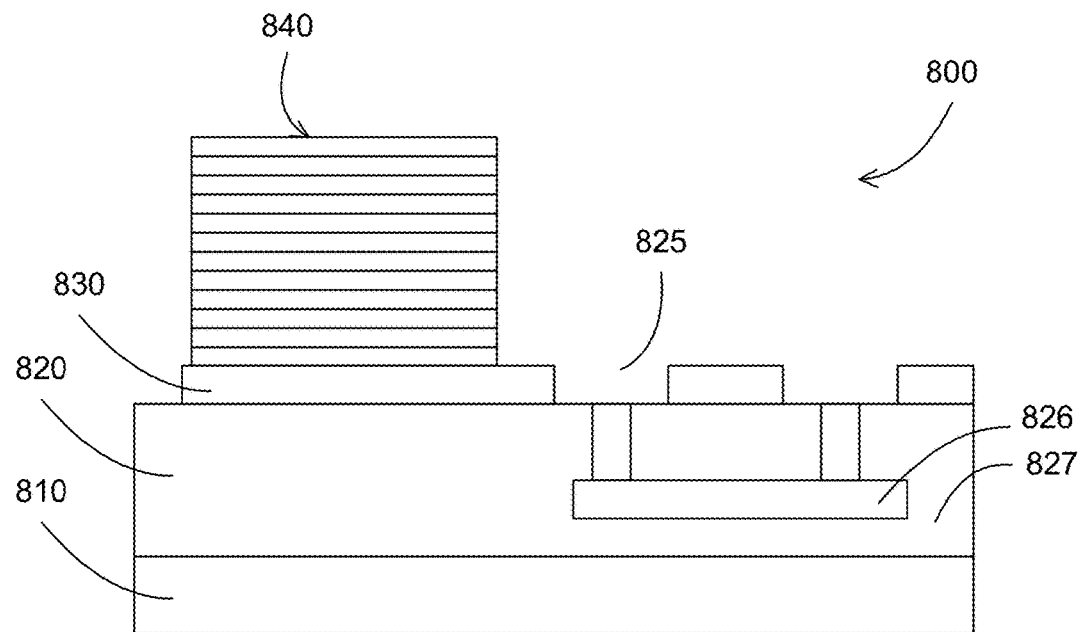
FIG. 8A-8B show cross sectional schematic views of embodiments of integrated planar waveguides on a substrate with an interconnect layer in accordance with the inventive process.

Referring to FIG. 8, cross sectional schematics of embodiments of the inventive optical dielectric interposer structure 800 and the submount assembly 805 are shown. In FIG. 8A, an embodiment for interposer 800 includes substrate 810, optional interconnect layer 820, and planar dielectric stack structure 840 disposed on the optional interconnect layer 820. Interconnect layer 820 is typically provided in embodiments for which interconnects are required for optical or electrical die mounted on the interposer 800 to form a submount assembly. Terminal pad opening 825 in the interconnect layer 820 provides connections for the optical and electrical die to the interconnect metal lines 826. Interconnect metal lines 826 within interconnect layer 820 form interconnects between electrical devices mounted onto the interposer 800, and in some embodiments, to form electrical connections for devices external to the interposer 800. In embodiments, the planar dielectric stack 840 includes buffer layer 830. In some other embodiments, openings in the buffer layer 830 provide access to underlying metal layers 826 through the interconnect layer openings 825. It is to be understood that the buffer layer 830 can be utilized for multiple purposes on the interposer 800 that include isolation, insulation, vertical spacing, alignment, and control of optical loss. In some embodiments, the patterning of the buffer layer 830 is not coincident with the pattern of the other layers in waveguides that are fabricated from the inventive dielectric stack structure 840. In yet other embodiments, the buffer layer can be a part of the intermetal dielectric 827 of the interconnect layer 820.

In embodiments, the intermetal dielectric 827 in the interconnect layer 820 generally provides electrical isolation for the metal interconnects 826. The interconnect layer 820 is a structure of metal lines 826 and intermetal dielectric 827 that provide insulated electrical interconnections for the electrical and optoelectrical die on the dielectric interposer 800, and in some embodiments, allow for the interconnection of devices mounted external to the interposer 800 but for which connections are required within the interposer 800. It is understood that optical devices that do not require electrical interconnection can also be attached in some embodiments to interconnect layers for the purpose of mechanical attachment without a specific requirement for electrical interconnection.

Figure 8B:
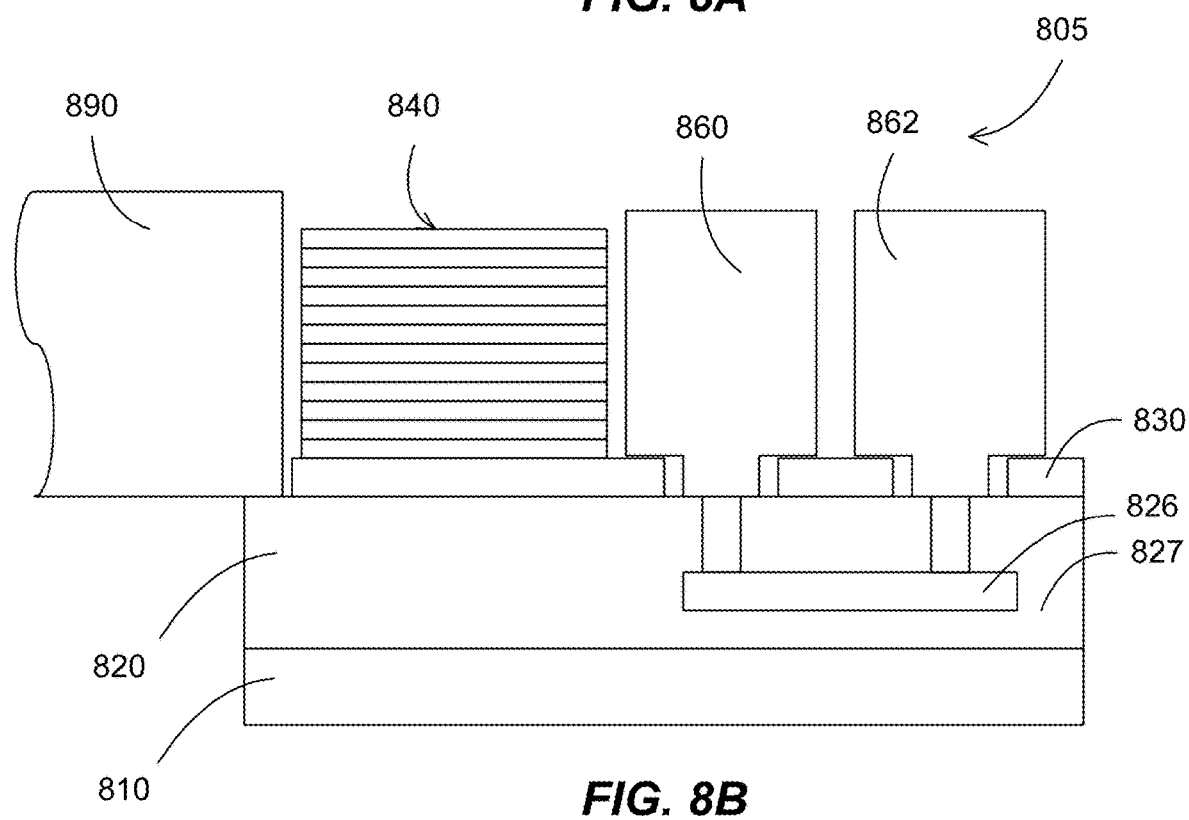

The inclusion of electrical, optical, and/or optoelectric devices forms a submount assembly 805 from the optical interposer 800 on substrate 810 with interconnect layer 820. In FIG. 8B, a cross sectional schematic of an embodiment of a submount assembly 805 with an optical fiber 890 positioned to provide an optical pathway between the optical fiber 890 and planar dielectric stack 840 is shown. FIG. 8B also shows optoelectrical device 860 and electrical device 862 mounted through buffer layer 830 to terminal pad openings 825 and connected to metal interconnect lines 826 in interconnect layer 820. In embodiments, intermetal dielectric 827 provides electrical insulation for the metal interconnects 826. In an embodiment, optical signals are received from optical fiber 890, are directed into planar waveguides fabricated from inventive dielectric stack 840, and routed to aligned optical or optoelectrical device 860 for processing, re-routing, or conversion to electrical signals, for example.

Figure 9A:
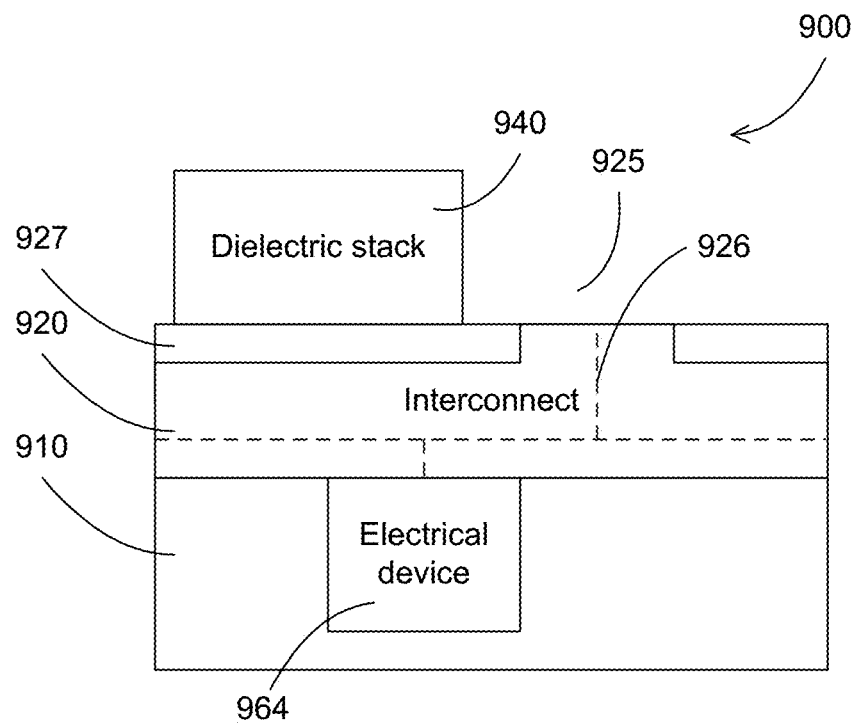
FIG. 9A-9B show cross sectional schematic views of embodiments of integrated planar waveguides on a substrate with interconnect layer and integrated electrical devices in the substrate in accordance with the inventive process.

Referring to FIG. 9, cross sectional schematics of embodiments of the inventive optical dielectric interposer 900 and submount assembly 905 are shown. In FIG. 9A, an embodiment for interposer 900 includes substrate 910, interconnect layer 920, inventive planar dielectric stack structure 940 disposed on interconnect layer 920, and integrated electrical device 964. In some embodiments, integrated electrical device 964 in the underlying substrate 910 is a transistor, capacitor, resistor, inductor, or other electrical device. In other embodiments, integrated electrical device 964 is a p-channel metal oxide semiconductor (PMOS) transistor, an n-channel metal oxide semiconductor (NMOS) transistor device or array of one or more of these devices. In some embodiments, the electrical device 964 is an array of transistor devices based on complementary metal oxide semiconductor (CMOS) technology. In some embodiments, transistor arrays 964 in the substrate 910, are used for signal processing, signal conditioning, signal generation, memory, and computation, for example. In some embodiments, terminal pad openings 925 in the interconnect layer 920 provide electrical connections between optoelectrical die and the interconnect metal lines 926. In some embodiments, the top intermetal dielectric 927 in the interconnect layer 920 resides below the dielectric stack 940 as shown in FIG. 9A, and in some embodiments, the upper layer of the intermetal dielectric 927 can also serve as the buffer layer 930. The interconnect layer 920 is a structure of metal lines 926 and intermetal dielectric 927 that provide electrical connections for interconnecting electrical and optoelectrical devices and die that are fabricated on, mounted in, or are connected external to the dielectric interposer 900.

In some embodiments, the top layer of the interconnect layer 920 may be electrically conductive or insulating. Some parts of the top layer of interconnect layer 920 can be insulating, and some parts of the top layer of interconnect layer 920 can be conductive. In preferred embodiments in which electrical or optoelectrical die are mounted onto the interposer 900, metal lines 926 are routed within the interconnect layer 920 to provide electrical connections for the devices in, on, or connected to the interposer 900, and to underlying electrical devices 964.

Figure 9B:
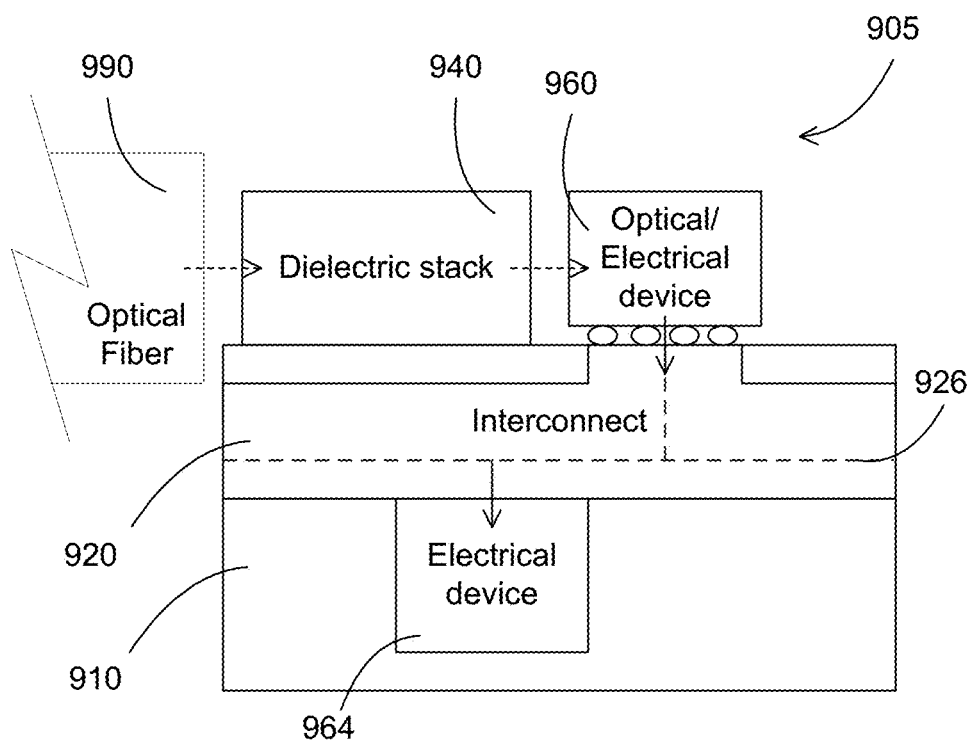

Submount assembly 905 is formed from the optical dielectric interposer 900 by the inclusion of optical, electrical, and optoelectric devices 960 onto the interposer 900. FIG. 9B shows a cross sectional schematic of an embodiment of a submount assembly 905 with optical fiber 990 positioned to provide an optical pathway between the optical fiber 990 and a waveguide fabricated from the inventive planar dielectric stack 940. FIG. 9B also shows optoelectrical device 960 mounted to terminal pad openings 925 on interconnect layer 920. In embodiments, optical signals are received from optical fiber 990, into planar waveguides formed from the inventive dielectric stack 940 and routed to optoelectrical or optical device 960 for processing, re-routing, or conversion to electrical signals, for example. In some embodiments, optoelectrical die 960 are connected to one or more of electrical devices 964 via metal lines 926 in the interconnect layer 920. In these embodiments, the optical signals may also originate, wholly or in part, on the submount assembly 905 from which the signals can be transmitted through the planar waveguide structures 940 to the optical fiber 990.

In other embodiments, the optical signals originate on the submount assembly 905 and are transmitted through one or more planar waveguide structures formed from the inventive dielectric stack 940 to the optical fiber 990. In yet other embodiments, the signals are received from the optical fiber 990 for one or more of processing, routing, and conversion to electrical signals.

Figure 10A:
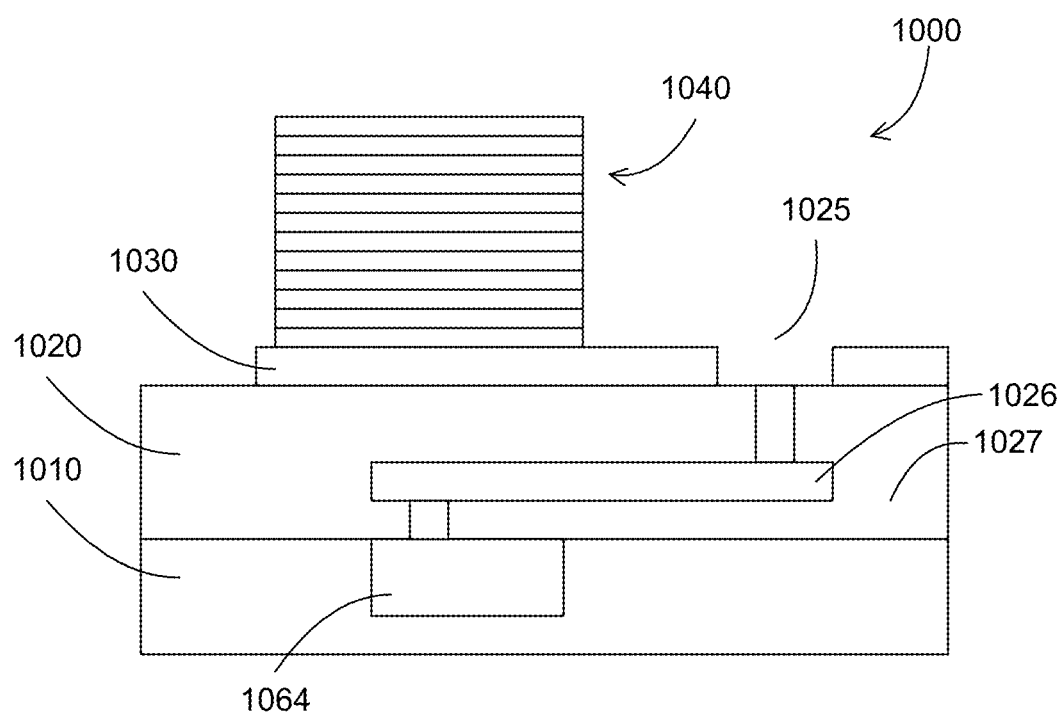
FIG. 10A-10B show cross sectional schematic views of embodiments of integrated planar waveguides on a substrate with interconnect layer and integrated electrical devices in the substrate in accordance with the inventive process shown with interconnections between top surface mounted device and integrated electrical devices in the substrate.

Referring to FIG. 10, cross sectional schematics of embodiments of the inventive optical dielectric interposer 1000 and submount assembly 1005 are shown. In FIG. 10A, an embodiment for interposer 1000 includes substrate 1010, optional interconnect layer 1020, inventive planar dielectric stack structure 1040 disposed on the optional interconnect layer 1020, and integrated electrical device 1064 in substrate 1010

In some embodiments, integrated electrical device 1064 in the underlying substrate 1010 is a transistor, capacitor, resistor, inductor, or other electrical device. In other embodiments, integrated electrical device 1064 is a p-channel metal oxide semiconductor (PMOS) or n-channel metal oxide semiconductor (NMOS) device, or array of one or more of these devices. In other embodiments, electrical device 1064 is an array of transistors based on complementary metal oxide semiconductor (CMOS) technology. In some embodiments, transistor arrays 1064 in the substrate 1010 are used for signal processing, signal conditioning, signal generation, memory, and computation, for example. In some embodiments, the terminal pad opening 1025 in the interconnect layer 1020 provides for electrical connections of optoelectrical die to the interconnect metal lines 1026 in interconnect layer 1020. In some embodiments, the top layer of the intermetal dielectric 1026 in the interconnect layer 1020 resides below the dielectric stack 1040. In some embodiments, the planar dielectric stack 1040 includes buffer layer 1030. In yet other embodiments with buffer layer 1030 in dielectric stack 1040, the buffer layer 1030 resides within or above the interconnect layer 1020. Interconnect layer 1020 is typically provided in embodiments for which interconnects are required for optoelectrical die mounted on the interposer 1000 to form a submount assembly 1005. The interconnect layer 1020 is a structure of metal lines 1026 and intermetal dielectric films 1027 that provide metal connections for interconnecting optical, electrical, and optoelectrical devices and dies that are fabricated on, mounted in, or connected external to the dielectric interposer 1000.

Figure 10B:
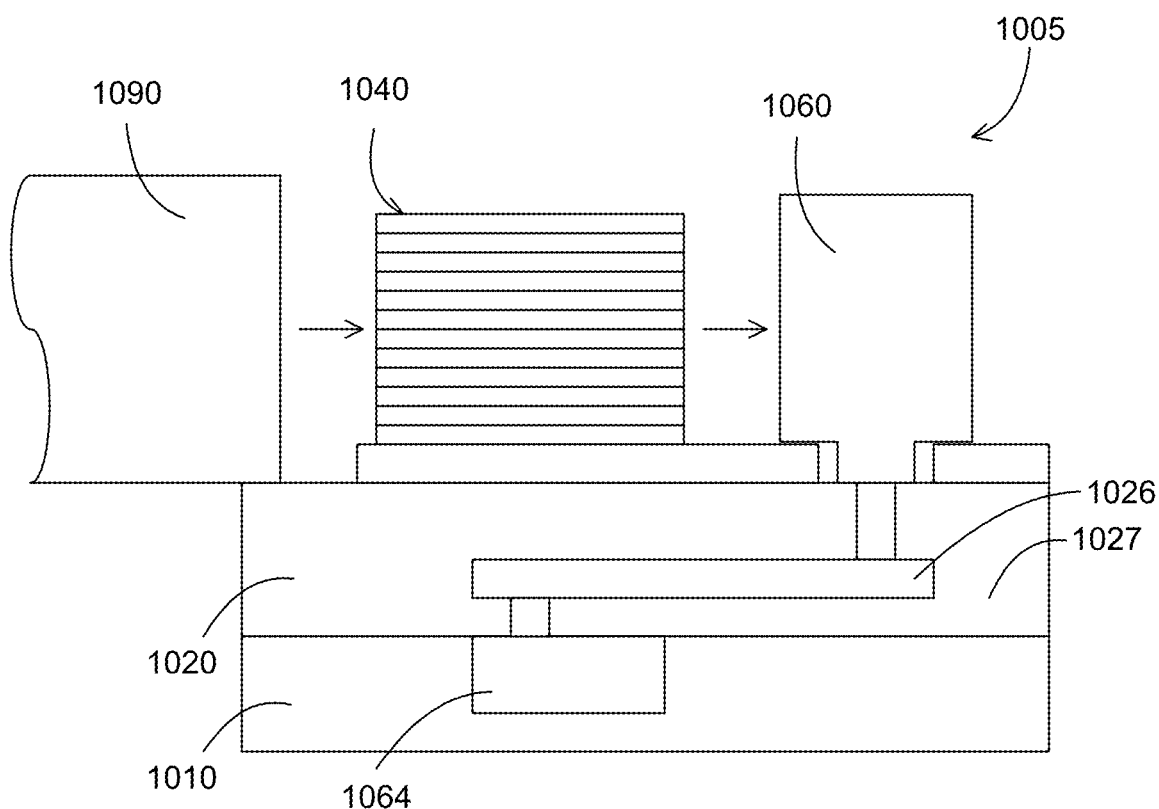

In some embodiments, the terminal pad openings 1025 in the interconnect layer 1020 provide connections for optoelectrical die 1060 to the interconnect metal lines 1026 as shown in FIG. 10B. Interconnect metal lines 1026 within interconnect layer 1020 form interconnects between optoelectrical devices 1060 and optional electrical devices (not shown) mounted onto the interposer, or to form connections for one or more of optoelectrical devices and electrical devices connected external to the interposer 1000.

In some embodiments, the top layer of the interconnect layer 1020 may be electrically conductive or insulating. In preferred embodiments in which optical die are to be mounted onto the interposer 1000, metal traces 1026 are routed within the interconnect layer 1020 that are accessible through openings 1025 to provide electrical and mechanical connections for the optical, electrical, and optoelectrical devices in, on, or connected to the interposer 1000, and to the underlying electrical device 1064. It is to be understood that the mounting of purely optical die (i.e., die that have an optical function but that are not electrical) as in a discrete waveguide for example, can benefit from the methods of mechanical attachment commonly used in the attachment of electrical die. Attachment of purely optical devices using electrical bond pads is within the scope of the current invention as described herein.

In some embodiments, intermetal dielectric 1027 in the interconnect layer 1020 provides electrical isolation for the metal interconnects 1026. The interconnect layer 1020 is a structure of metal traces 1026 and intermetal dielectric 1027 that provides electrically insulated interconnections for the optical, electrical, and optoelectrical die 1060 on the dielectric interposer 1000, and in some embodiments, allow for the interconnection of devices mounted external to the interposer 1000 but for which connections are required within the interposer 1000.

Submount assembly 1005 is formed from the optical interposer 1000 by the inclusion of electrical, optical, optoelectric devices 1060 onto the interposer 1000. FIG. 10B shows a cross sectional schematic of an embodiment of a submount assembly 1005 with optical fiber 1090 positioned to provide an optical pathway between the optical fiber 1090 and a waveguide fabricated from the inventive planar dielectric stack 1040. FIG. 10B also shows optoelectrical device 1060 mounted to terminal pad openings 1025 in interconnect layer 1020. In some embodiments, terminal pad openings 1025 are provided through openings in the buffer layer 1030, or another layer on the surface of the interconnect layer 1020. In some embodiments, optical signals are received from optical fiber 1090, into planar waveguides formed from the inventive dielectric stack 1040 and routed to optoelectrical or optical device 1060 for processing, re-routing, or conversion to electrical signals, for example. In some embodiments, optoelectrical die 1060 are connected to one or more electrical devices 1064 via metal lines 1026 in the interconnect layer 1020.

In other embodiments, the optical signals originate on the submount assembly 1005 and are transmitted through planar waveguides formed from the inventive dielectric film structure 1040 to the optical fiber 1090. In yet other embodiments, the signals are received from the optical fiber 1090 to the submount assembly 1005 for one or more of processing, routing, and conversion to electrical signals.

Referring to FIG. 11, cross sectional schematics of embodiments of the inventive optical dielectric interposer structure 1100 and submount assembly 1105 are shown. In FIG. 11A, interposer 1100 is shown and includes substrate 1110 and interconnect layer 1120. Interconnect layer 1120 is a structure of metal traces 1126 and intermetal dielectric material 1127 within which conductive pathways are provided for interconnecting electrical and optoelectrical devices and die that are formed on, mounted in, or connected to the dielectric interposer 1100. In some embodiments, interconnected devices are interconnected to the interposer 1100 from an external mount or submount assembly. The dotted lines in interconnect layer 1120 shown in FIG. 11A schematically represent examples of electrical pathways 1126 within the interconnect layer 1120 for interconnecting optoelectrical devices and electrical devices mounted to terminal pad interconnect openings 1125, for example. FIG. 11A shows inventive dielectric stack 1140 mounted via bonding pads 1122 as a discrete dielectric waveguide component 1165 to interconnect layer 1120. In some embodiments, the dielectric stack 1140 is fabricated or formed independently of the substrate 1110 and the interconnect layer 1120, and then added as a discrete element to form interposer 1100. It is important to note that the formation of interposer 1100 may be accomplished concurrently with the formation of submount assembly 1105 for embodiments in which the discrete waveguide components 1165, with inventive dielectric stack 1140, are added to interposer 1100 concurrently with optoelectrical and electrical components 1160 as shown in FIG. 11B.

In embodiments, discrete waveguide component 1165, fabricated with the inventive dielectric stack 1140, is a simple conduit for the transmission of optical signals. In other embodiments, one or more discrete waveguide components 1165 on submount assembly 1105 are conduits for the transmission of optical signals from an optical fiber attached to the submount assembly to one or more locations on the submount assembly. In yet other embodiments, discrete waveguide components 1165 on submount assembly 1105 are conduits for the transmission and distribution of optical signals from one or more optical fibers attached to the submount assembly to one or more locations on the submount assembly 1105. In yet other embodiments, discrete waveguide components 1165 on submount assembly 1105 can include one or more of a spot size converter, a filter, an arrayed waveguide, a multiplexers, a demultiplexer, a grating, a power combiner, and the like.

Figure 11A:
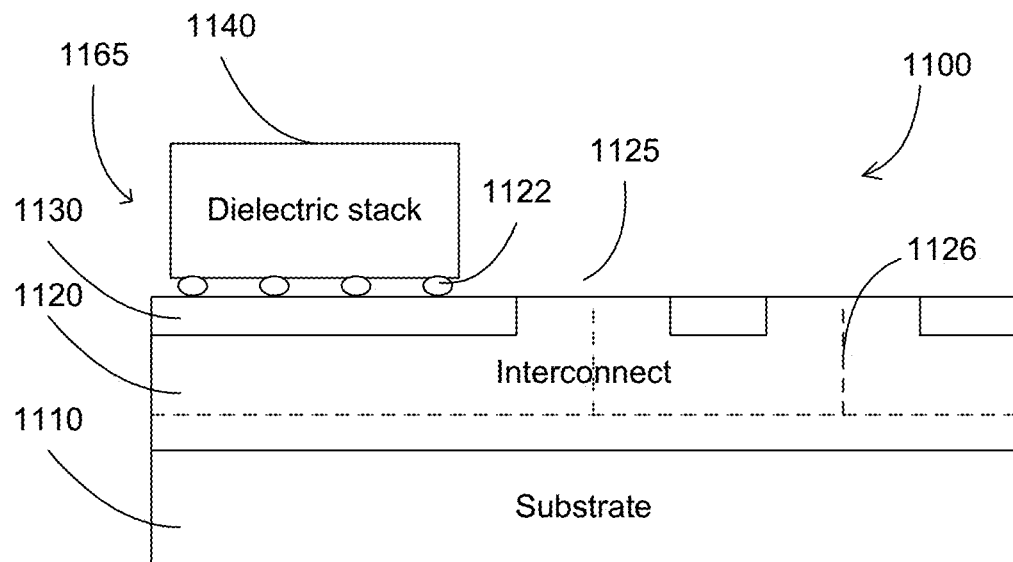
FIG. 11A-11D show cross sectional schematic views of embodiments of a substrate with interconnect layer.
Figure 11B:
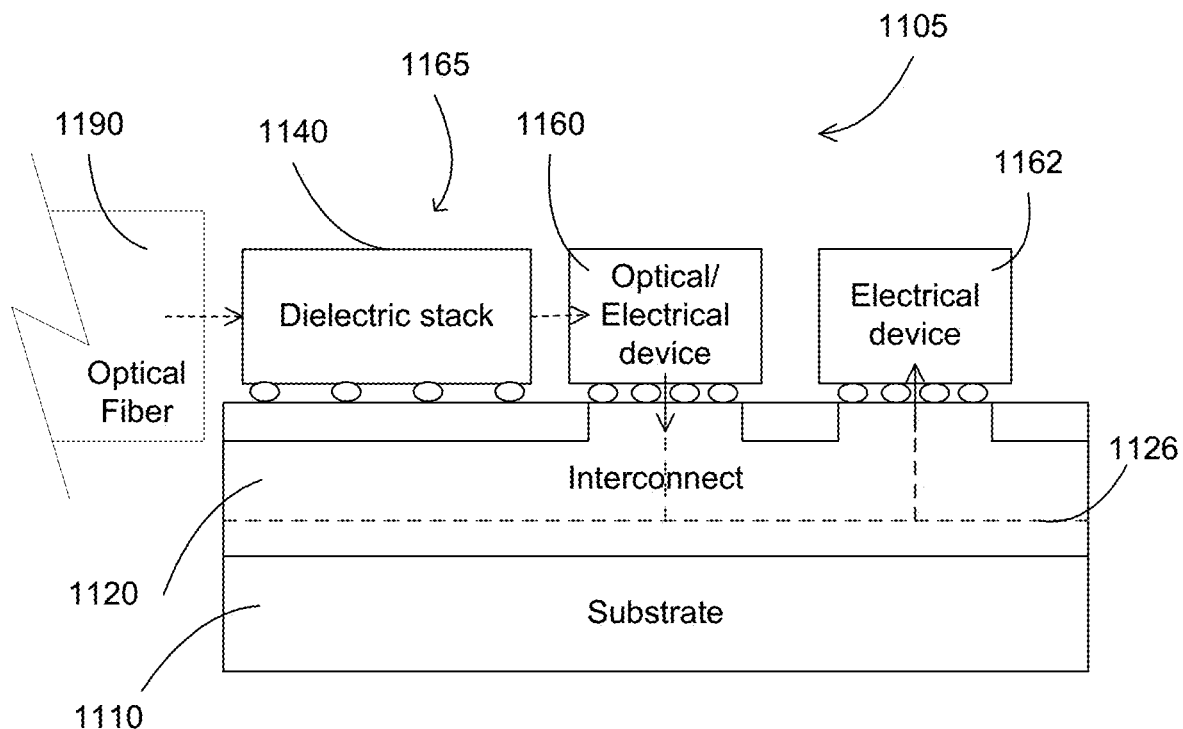

In FIG. 11B, inventive planar dielectric stack structure 1140 is shown as discrete waveguide component 1145 attached to the interconnect layer 1120 on substrate 1110. Submount assembly 1105 is formed from the optical dielectric interposer 1100 by the inclusion of optical, electrical, and optoelectrical devices 1160, 1162 onto the interposer 1100. FIG. 11B shows a cross sectional schematic of an embodiment of a submount assembly 1105 with optical fiber 1190 positioned to provide an optical pathway to the discrete dielectric waveguide component 1165. In the embodiment shown in FIG. 11B, the inventive planar dielectric stack 1140 is a pre-fabricated discrete optical waveguide component 1165 mounted to interposer 1100. FIG. 11B shows optoelectrical device 1160 mounted to terminal pad openings 1125 in interconnect layer 1120 to form submount assembly 1105. In an embodiment, optical fiber 1190 is aligned to discrete waveguide 1165, formed from inventive dielectric stack 1140, which is further aligned to optical device 1160 to allow for the receiving and sending of optical signals for processing, re-routing, or conversion to electrical signals, for example. Optical alignment of devices to the waveguide, in embodiments, provides less than 1 dB power loss, and in preferred embodiments, less than 0.5 dB. Accurate alignment is essential to reducing power loss to tolerable levels.

Terminal pad openings 1125 in the interconnect layer 1120 provide for connections of optoelectrical die 1160 to the interconnect metal traces 1126. In preferred embodiments in which optoelectrical die 1160 are mounted onto the interposer 1100, metal traces 1126 are routed within the interconnect layer 1120 to provide electrical and mechanical connections 1126 for optical, electrical, and optoelectrical devices in, on, or connected to the interposer 1100. In embodiments, the intermetal dielectric 1127 in the interconnect layer 1120 provides electrical isolation for the metal interconnects 1126. The interconnect layer 1120 is a structure of metal lines and traces 1126 and intermetal dielectric 1127 that provide interconnections for the optical, electrical, and optoelectrical die 1160, 1162 on the dielectric interposer 1100, and in some embodiments, allow for the interconnection of devices mounted external to the interposer 1100 but for which connections are required on or within the interposer 1100.

Figure 11C:
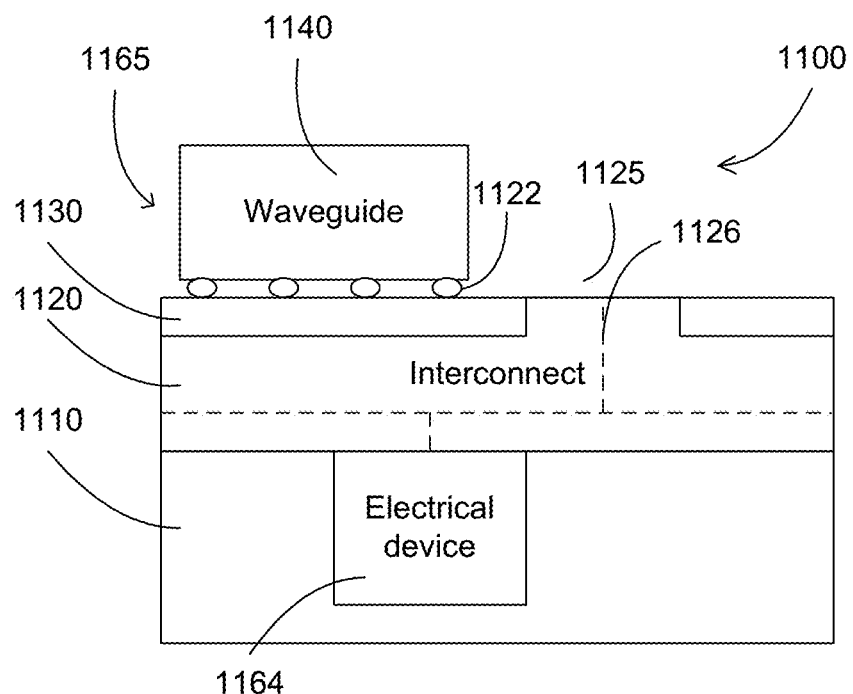

In FIG. 11C, interposer 1100 is shown and includes substrate 1110, interconnect layer 1120, discrete waveguide component 1165, and integrated electrical device 1164. Interconnect layer 1120 is a structure of metal lines and traces 1126 and intermetal dielectric material 1127 within which conductive pathways for interconnecting electrical and optoelectrical devices 1160, 1162 that are fabricated on, mounted in, or connected from an external submount assembly to the dielectric interposer 1100, or provided in underlying substrate 1110. The dotted lines in interconnect layer 1120 shown in FIG. 11C schematically represent examples of electrical pathways 1126 within the interconnect layer 1120 for interconnecting optoelectrical devices 1160 and electrical devices 1162 mounted to terminal pad interconnect openings 1125. In preferred embodiments in which optoelectrical die 1160 are mounted onto the interposer 1100, metal interconnects 1126 are routed within the interconnect layer 1120 to provide electrical and mechanical connections for electrical and optoelectrical devices in, on, or connected to the interposer 1100, and to the underlying electrical devices 1164. Integrated electrical device 1164 in underlying substrate 1110, in some embodiments, is one or more of a transistor, capacitor, resistor, inductor, or other electrical device, or array of electrical devices. In other embodiments, integrated electrical device 1164 is a p-channel metal oxide semiconductor (PMOS) transistor or an n-channel metal oxide semiconductor (NMOS) device, or array of one or more of these devices. In yet other embodiments, device 1164 is an array of transistors based on complementary metal oxide semiconductor (CMOS) transistor technology. In yet other embodiments, the integrated electrical device 1164 is a bipolar transistor or an array of bipolar transistor devices. In yet other embodiments, the integrated electrical device 1164 is a field effect transistor or an array of field effect transistors. In some embodiments, transistor arrays 1164 in the substrate 1110, are used for signal processing, signal conditioning, signal generation, memory, and computation, for example.

In FIG. 11C, the inventive dielectric stack 1140 is shown in the form of a discrete dielectric waveguide component 1165 mounted to interconnect layer 1120 via bonding pads 1122. In some embodiments, the dielectric stack 1140 is fabricated independently of the substrate 1110 and the interconnect layer 1120, and then added as a discrete element to form interposer 1100 as shown, for example, in FIG. 11C. Although electrical connections are not required for optical waveguides, bonding pads 1122, in some embodiments, are similar to bond pads used to form electrical connections. In other embodiments, other adhesion methods are used that include adhesive, epoxy, or other bonding material.

Figure 11D:
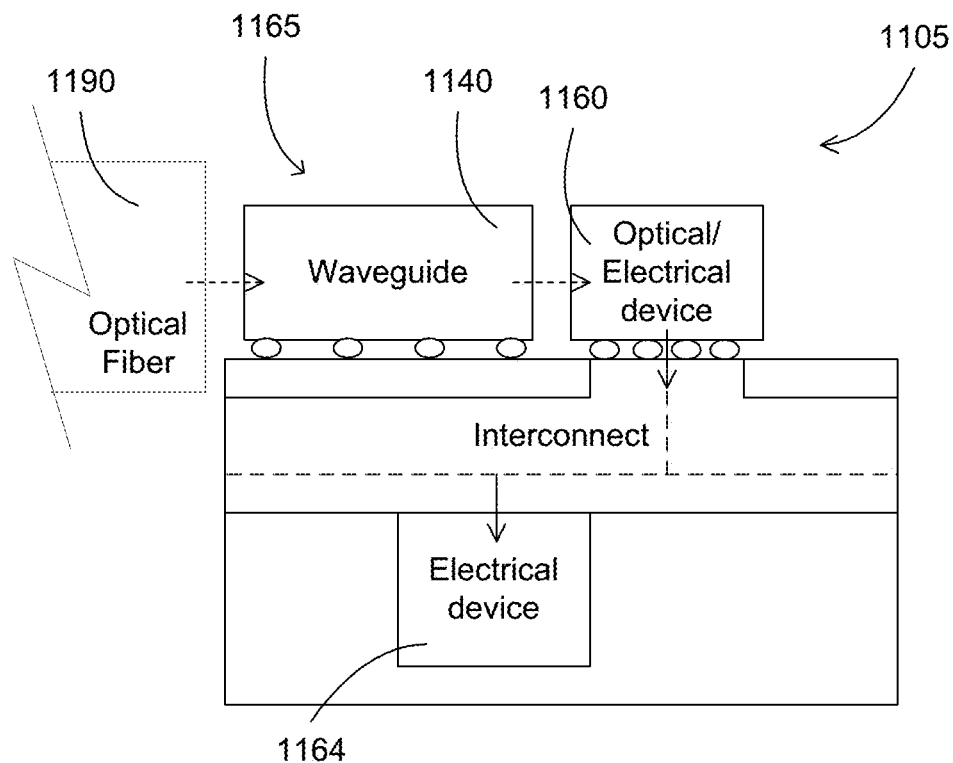

Submount assembly 1105, shown in FIG. 11D, is formed from the optical interposer 1100 with the inclusion of electrical, optical, optoelectric devices on the interposer 1100. It is important to note that the formation of inventive interposer 1100 with the addition of the discrete waveguide 1165 is accomplished concurrently with the formation of submount assembly 1105 for embodiments in which the discrete waveguide components 1165 are added to interposer 1100 concurrently with optical, optoelectrical, and electrical components 1160. FIG. 11D shows a cross sectional schematic of an embodiment of a submount assembly 1105 with optical fiber 1190 positioned to provide an optical pathway between the optical fiber 1190 and a planar waveguide 1165 fabricated from the inventive planar dielectric stack 1140. FIG. 11D also shows optoelectrical device 1160 mounted to terminal pad openings 1125 in interconnect layer 1120. In an embodiment, optical signals are received from optical fiber 1190, into planar waveguides 1165 formed from the inventive dielectric stack 1140 and routed to optoelectrical or optical device 1160 for processing, re-routing, or conversion to electrical signals, for example. In some embodiments, optoelectrical die 1160 are connected to one or more electrical devices 1162 and integrated electrical devices 1164 via metal lines 1126 in the interconnect layer 1120. In embodiments, optical fiber 1190 is aligned to discrete waveguide 1165, formed from inventive dielectric stack 1140, which is further aligned to optical device 1160 to allow for the receiving and sending of optical signals for processing, re-routing, or conversion to electrical signals, for example. Optical alignment of devices to the waveguide, in embodiments, provides less than 1 dB power loss and in other embodiments, less than 0.5 dB. In preferred embodiments, power loss is much less than 0.5 dB. Accurate alignment between the optical fiber and the discrete waveguide 1165 fabricated from the inventive dielectric stack 1140, and between the dielectric stack 1140 and the optical or optoelectrical device 1160, is necessary to reduce potential power loss to tolerable levels.

In some embodiments, the optical signals originate on the submount assembly 1105 and are transmitted through planar dielectric waveguide structure 1140 to the optical fiber 1190. In yet other embodiments, the signals are received from the optical fiber 1190 for one or more of processing, routing, and conversion to electrical signals.

Referring to FIG. 12A, the steps of forming a dielectric interposer with a patterned waveguide from the inventive dielectric stack structure are shown that include a providing step 1000, a depositing step 1210, and a patterning step 1220.

In providing step 1200, a substrate is provided with one or more optoelectrical or electrical devices coupled to an interconnection layer. In embodiments, these devices are one or more of a transistor, capacitor, resistor, inductor, or other electrical device, or an array of one or more electrical devices. In other embodiments, these devices are one or more of a p-channel metal oxide semiconductor (PMOS) transistor and an n-channel metal oxide semiconductor (NMOS) device or devices. In yet other embodiments, the devices are an array of transistors based on complementary metal oxide semiconductor (CMOS) transistors technology. In yet other embodiments, the one or more devices coupled to the interconnection layer as described in providing step 1200 in FIG. 12A is a bipolar transistor, two or more bipolar transistors, or an array of bipolar transistor devices. In yet other embodiments, the one or more devices is a field effect transistor, two or more field effect transistors, or an array of field effect transistors. In some embodiments, transistor arrays coupled to the interconnect layer are used for signal processing, signal conditioning, signal generation, memory, and computation, for example.

In depositing step 1210, a stack of dielectric layers is deposited on the substrate to form the unpatterned inventive dielectric stack on the substrate, which is then patterned in patterning step 1220 to form the inventive interposer. In some embodiments, the patterned dielectric stack structure can be a section of waveguide aligned to an optical or electrical device, for example, for the transmission of optical signals to and from an optical fiber connected to the submount assembly. In other embodiments, these waveguides can include sections of the inventive dielectric stack that are patterned spot size converters, filters, arrayed waveguides, multiplexers, demultiplexers, gratings, power combiners, and the like. In yet other embodiments, these waveguides can provide part of a mechanical structure for the formation of hermetic seals. In yet other embodiments, theses waveguides can be a combination of one or more of these types of structures fabricated from the inventive dielectric stack structure. In yet other embodiments, the buffer layer and the layers of the repeated stack are patterned to form a filter, an arrayed waveguide, a grating, a multiplexer, a demultiplexer, a spot size converter, or a power combiner, and the like.

In embodiments, the patterning step 1220 is used to pattern the blanket dielectric stack structures into one or more planar waveguides. Patterning steps can include the use of established photoresist layers, used either directly as a mask for wet or dry etching or etch processing, or via a photoresist layer used to transfer a pattern from the photoresist to a hard mask which is utilized for wet or dry etching or etch patterning of the inventive dielectric film stack. Processes for photoresist patterning and subsequent wet and dry etching of film structures are well established for those skilled in the art of dielectric film patterning techniques.

Referring to FIG. 12B, steps of forming a submount assembly with the inventive interposer are shown that include providing step 1240, a first coupling step 1250, and a second coupling step 1260. In providing step 1240, a substrate is provided wherein the substrate includes at least a first device coupled to an interconnection layer, wherein the substrate includes a waveguide patterned from a stack of dielectric layers. Patterned waveguide structures include filters, arrayed waveguides, gratings, multiplexers, demultiplexers, spot size converters, power combiners, and the like. In the first coupling step 1250, a second device is coupled to the substrate, wherein the device is configured to interface between the waveguide and the at least a device. In embodiments, the second device is a receiving device, for example, such as a photodiode for receiving optical signals transmitted through the waveguide and subsequently converting the optical signals to electrical signals that are delivered to the interconnect layer. Conversely, in other embodiments, the second device is a sending device, for example, such as a laser for converting electrical signals from the interconnect layer, for example, to optical signals for transmission to the waveguide. In the second coupling step 1260, an optical fiber is coupled to the substrate, wherein the optical fiber is configured to interface with the waveguide. Optical fibers are typically used in communication networks for the transmission of optical signals between submount assemblies and over long distances. By contrast, planar waveguides and the transmission of optical signals in free space are used to transmit optical signals within submount assemblies and over short distances. Optical fibers that are used to deliver optical signals are typically connected to the substrate and aligned with waveguides or other devices, such as a lens, to provide the necessary interface for transferring the optical signals from the fiber to the submount assembly to which the optical fiber is connected.

Figure 13A:
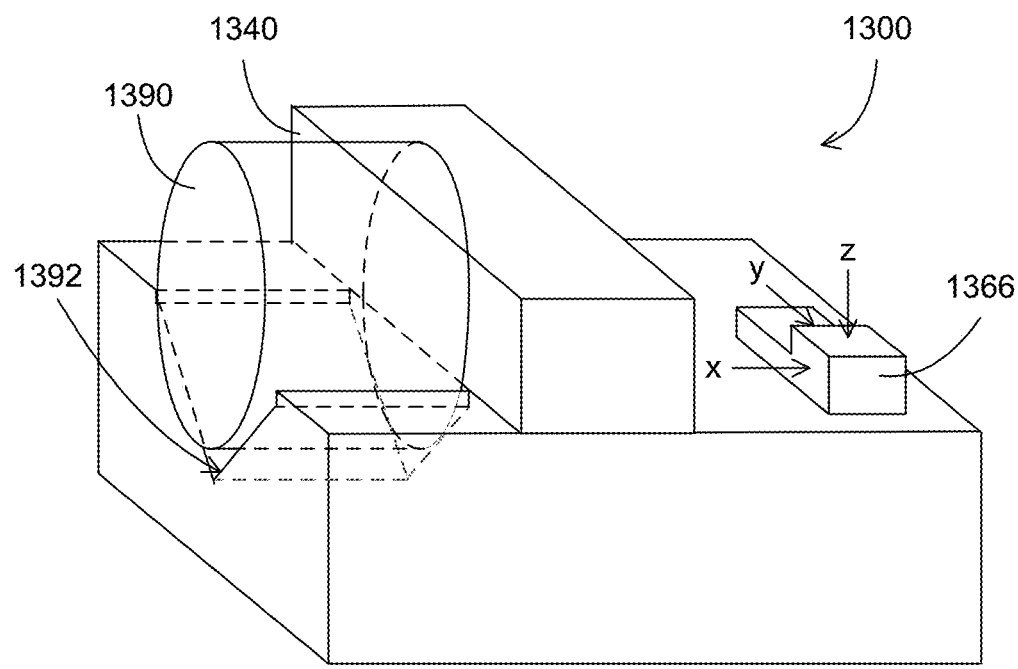
FIG. 13A shows a perspective schematic view of a substrate with patterned inventive dielectric waveguide structure, with a v-groove for mounting and alignment of an optical fiber and with mechanical stops for the mounting and alignment of optical and electrical devices and die.

Referring to FIG. 13A, a perspective view of interposer 1300 is shown for an embodiment that includes inventive dielectric film stack 1340 patterned to form a waveguide, a v-groove 1392 for coupling and aligning an optical fiber to the interposer 1300, and x-y-z stop structure 1366 for aligning devices to the patterned dielectric stack 1340. In the embodiment shown in FIG. 13A, x-y-z stop structure 1366 is a single element. In other embodiments, any one of the x-stop, y-stop, and z stop can be combined to facilitate the alignment of optical and optoelectrical devices to the submount assembly. In yet other embodiments, the x-stop, a y-stop, and a z-stop can be in one or more individual parts, or multiple parts, to provide the same function of aligning devices in each of the x, y, and z directions identified in FIG. 13A. In other embodiments, one or more stops are provided for one of the x, y, and z directions. In yet other embodiments, one or more stops are provided for two or three of the x, y, and z directions. And in yet other embodiments, multiple stops are provided for one or more of the x, y, and z directions. In yet other embodiments, one or more alignment marks are provided in addition to the stops. In yet other embodiments, alignment marks are provided to align the optical, optoelectrical, and electrical devices without the stops.

Figure 13B:
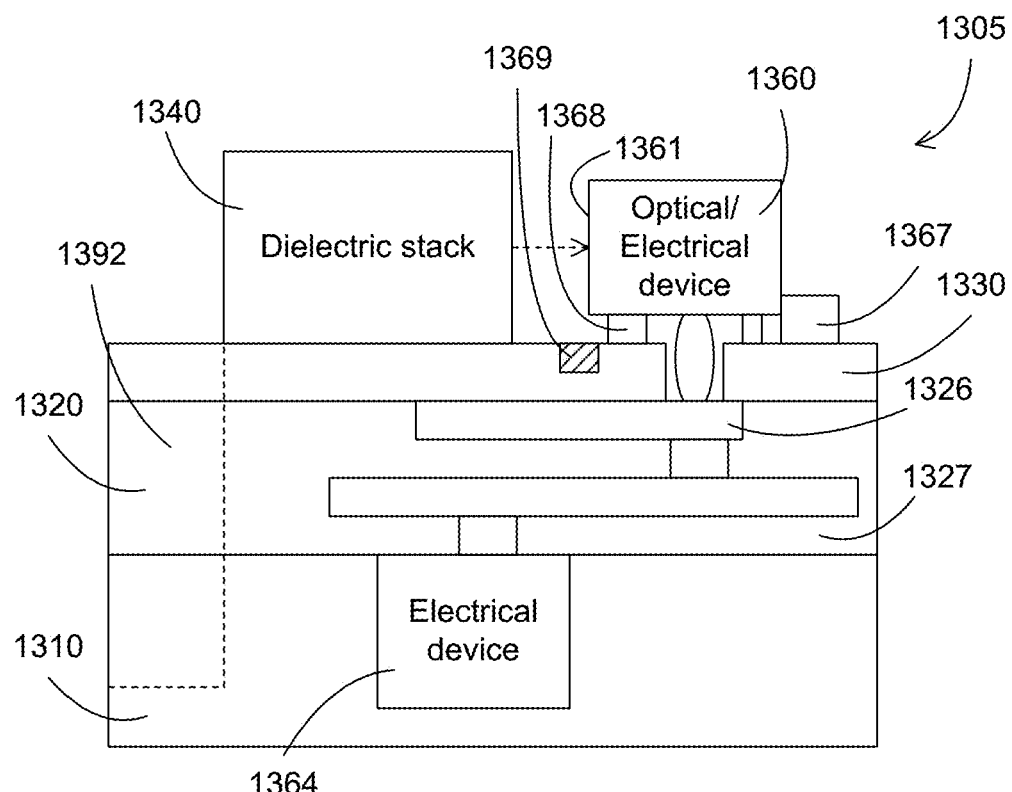
FIG. 13B shows a cross sectional schematic view of embodiments of integrated planar waveguide structures on a substrate with alignment mark and stops for alignment of optical/electrical devices.

Referring to FIG. 13B, a cross sectional schematic of an embodiment for submount assembly 1305 is shown that is formed on interconnect layer 1320 on substrate 1310 with inventive dielectric stack 1340. In the embodiment shown in FIG. 13B, features 1367, 1368, 1369 are provided for the alignment of optical or electrical device 1360 to the planar waveguide fabricated from the dielectric stack 1340. Optoelectrical device 1360 is connected through buffer layer 1330 to metal layer 1326. Metal layers 1326 are insulated with intermetal dielectric 1327 in interconnect layer 1320. In some embodiments, interconnect metal layers 1326 connect optoelectrical devices 1360 to integrated electrical devices 1364 in the substrate 1310 or to other devices in the submount assembly 1305. Alignment of optical/optoelectronic device 1360 is required to align the optical sending or receiving side 1361 of optical or optoelectrical device 1360 to the planar waveguide formed from the inventive dielectric stack structure 1340 and to thereby allow for the transfer of optical signals between the planar waveguide formed from the inventive dielectric stack structure 1340 and the optical or optoelectrical device 1360. It is important to note that for embodiments in which the device 1360 is an optical device, alignment is required within the submount assembly 1305 to provide for the transfer of optical signals between the planar waveguides and the device 1360 in the submount assembly 1305, but not necessarily for electrical connections. In some embodiments, however, metal bond pads are implemented to attach optical devices 1360. Alignment of the planar waveguides formed from the inventive dielectric stack structure 1340 to optical fiber 1390 is achieved in some preferred embodiments with v-groove 1392 in substrate 1310.

In an embodiment shown in FIG. 13B, substrate 1310 is shown with optional integrated device 1364. Integrated electrical devices 1364, in preferred embodiments, are connected to the interconnect layer 1320. Interconnect layer 1320 is a structure of metal lines 1326 and intermetal dielectric layers 1327 that provide insulated conductive pathways for interconnecting electrical and optoelectrical devices and dies that are fabricated on, mounted in, or connected from an external submount assembly to the submount assembly 1305. In preferred embodiments in which optoelectrical die 1360 are mounted onto the submount assembly 1305, metal interconnects 1326 are routed within the interconnect layer 1320 to provide electrical connections for electrical and optoelectrical devices in, on, or connected to the submount assembly 1305, and to the underlying electrical devices 1364.

Alignment marks 1365 are provided in some preferred embodiments for the alignment of optical, electrical, and optoelectrical devices on the submount assembly 1305. In some embodiments, alignment marks are provided in the buffer layer 1330 or the top layer of the interconnect layer 1320 of the interposer 1300 for alignment of devices, such as the optoelectrical device 1360, within the submount assembly. Alternatively, alignment marks can be provided in other layers, on or in, the substrate. In preferred embodiments, alignment mark 1369 is for optical alignment, as is used in automated die placement tools for example, to position the die onto the submount assembly 1305. Alignment mark 1369 in embodiments is a patterned feature in or on a layer or the substrate in the submount assembly 1305. In some embodiments, the patterned features are an ink mark, a coloration mark, or discoloration mark of the top or another layer in the substrate or in one of the layers on the substrate. In some embodiments, the alignment mark is a means of providing optical contrast. Alignment mark 1369 in some embodiments is one or more of an etched feature, a deposited feature, a laser scribed feature, a feature created by exposure to an electron beam, or an ion milled feature.

Alignment features 1367 and 1368 provide physical stops for the alignment of optical die 1360, and other devices on the submount assembly 1305. Accurate placement of devices and waveguides on optical submount assemblies is necessary for the transmission of the optical signals through the optical circuit on the submount assembly 1305. In instances for which optical devices and features are not aligned, significant loss of the optical signal can occur, and in extreme circumstances can result in complete loss or blockage of the optical signal. Stop 1368, in the embodiment shown in FIG. 13B, is a z-direction stop, in that this stop is intended to fix the height (in the z-direction) of optoelectric device 1360 on the submount assembly 1305. Stop 1367, also in the embodiment shown in FIG. 13B, is an x-direction stop, in that this stop is intended to fix the location of the optoelectric device 1360 in the x-direction as referenced in FIG. 13A on the submount assembly 1305. In some embodiments, a y-direction stop is also included. And in yet other embodiments, one or more of an x-direction stop, a y-direction stop, and a z-direction stop are provided. In yet other embodiments, one or more stops are provided for each device 1360 mounted on the submount assembly 1305 that requires alignment.

Additionally, in preferred embodiments, a v-groove feature 1392 or other alignment feature is provided to align the optical fiber 1390 to the submount assembly 1305 and to planar waveguides formed from the inventive dielectric stack 1340.

Figure 14:
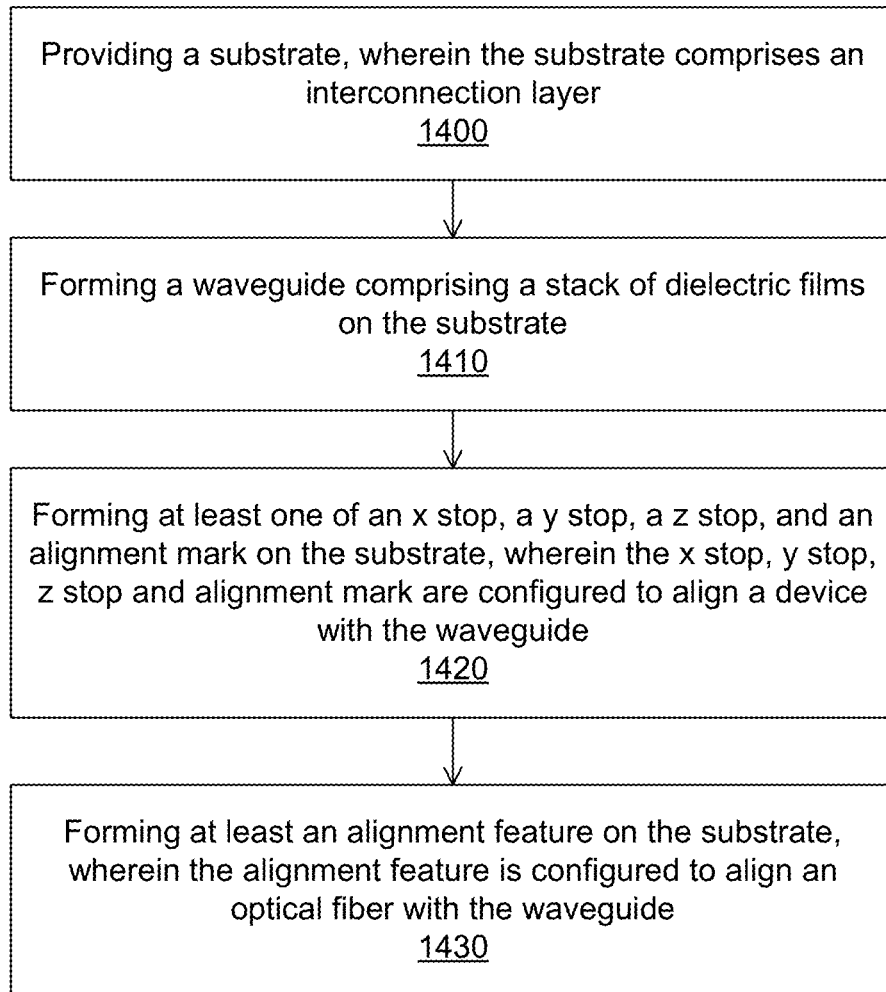
FIG. 14 shows steps in the fabrication of embodiments of the inventive dielectric film structures for providing patterned dielectric waveguides on substrates with features for the alignment of optical and electrical devices.

Referring to FIG. 14, steps for forming a dielectric interposer with a patterned waveguide from the inventive dielectric stack structure are shown that include a providing step 1400, a first forming step 1410, a second forming step 1420, and a third forming step 1430 as described herein. In providing step 1400, a substrate is provided wherein the substrate includes an interconnection layer (see interconnect layer 1320, for example.) In a first forming step 1410, a waveguide is formed that includes the inventive dielectric film structure on the substrate. In a second forming step 1420, at least one of an x-stop, a y-stop, a z-stop, and an alignment mark are formed on the substrate wherein the x-stop, a y-stop, a z-stop, and an alignment mark are configured to align a device with the waveguide. In a third forming step 1430, at least one alignment feature is formed on the substrate wherein the alignment feature is configured to align an optical fiber with the waveguide.

A specific benefit and feature of the planar dielectric waveguide structure is that in addition to its primary use for fabricating optical waveguides, it can also be used to produce mechanical features such as the alignment stops. In some embodiments, for example, the inventive dielectric stack is patterned using photoresist, for example, and then etched to a depth to establish the z-direction height, and for example, to create features for x-direction and y-direction stops as required. The capability to produce stops from the dielectric stack material, outside of the waveguide areas, provides an added benefit in implementing the planar dielectric stack structure on the inventive interposer. The use of the dielectric stack film stack to produce mechanical features such as the structures described for alignment stops and marks, as well other features described herein, is particularly enabled by the achievable thickness ranges of the inventive dielectric stacks. Thicknesses on the order of 2-25 micrometers are of the same thickness ranges that are suitable for alignment marks and stops. By combining the highly accurate vertical dimensioning capability that is achievable with highly controllable additive deposition technology with the highly controllable subtractive dry and wet etch technology, the relative heights of alignment features and stop features formed from the dielectric stack film structures can be formed with high accuracy. In addition to the applicable thickness benefits, the accuracy in the lateral dimensioning of the stops is generally provided by photolithographic patterning processes, which are highly accurate to within small fractions of a micrometer.

Figure 15A:
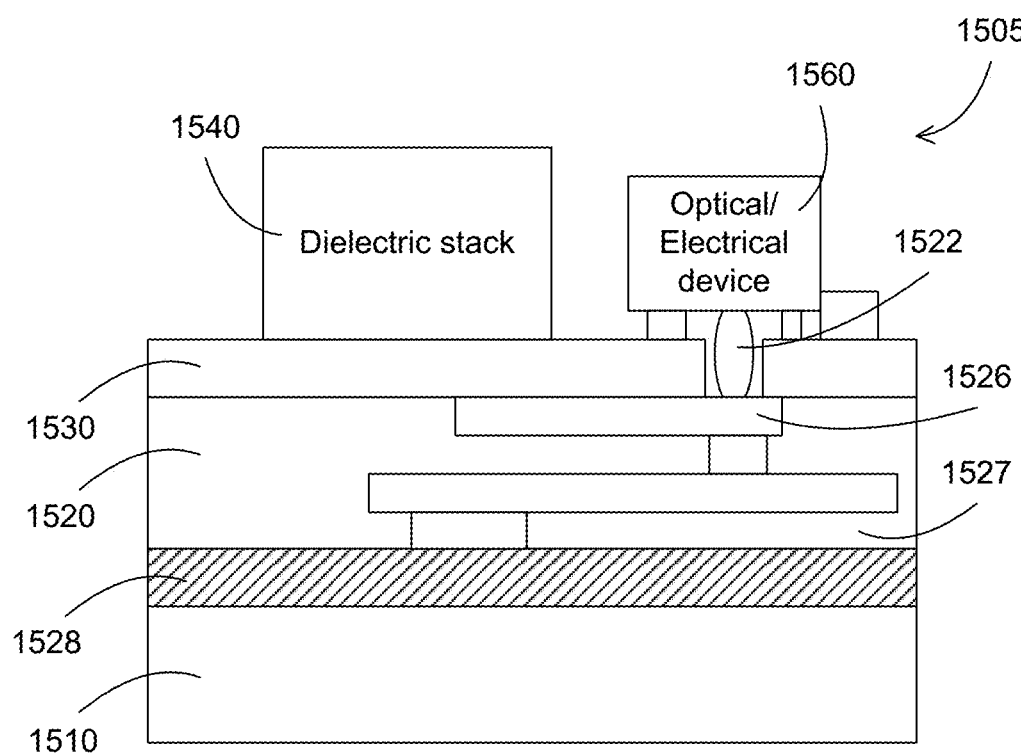
FIG. 15A-15B show cross sectional schematic views of embodiments of integrated planar waveguides on a substrate with integrated heat sink layer FIG. 15A on the substrate, and FIG. 15B within the interconnect layer.

Referring to FIG. 15A, submount assembly 1505, formed from interposer 1500, is shown that includes substrate 1510, interconnect layer 1520, and inventive dielectric stack 1540. Dielectric stack 1540 is patterned to form inventive planar dielectric waveguide. Interconnect layer 1520 is a structure of metal lines 1526 and intermetal dielectric 1527. Metal lines 1526 provide electrically conductive pathways for interconnecting electrical and optoelectrical devices and dies that are fabricated on, mounted in, or connected from an external submount assembly to the dielectric interposer 1500. In a preferred embodiment, one or more optoelectrical die 1560 are mounted onto the interposer 1500, and the metal interconnects 1526 are routed within the interconnect layer 1520 to provide electrical connections for electrical and optoelectrical devices in, on, or connected to the interposer 1500, or submount assembly 1505, and to underlying integrated electrical devices in the substrate, if present. It is to be understood that optical devices can be mounted with metal bond pads 1522, as means for mechanical bonding, without the specific requirement for electrical connections to other devices on the submount assembly 1505. A discrete waveguide (see 1140, for example) may not require electrical interconnection to other devices on the submount assembly 1505, but the same or similar bonding methodologies that are used for to provide mechanical bonding and electrical interconnection can be utilized to bond the optical device 1560 to the submount assembly 1505.

In optical circuits, and in particular, in optical circuits within which lasers are utilized for converting electrical signals to optical signals, significant levels of heat can be generated that may require dissipation in some embodiments to prevent premature failure of, or damage to, a submount assembly or components mounted on the submount assembly. In addition to lasers, other optical, electrical, and optoelectrical devices can generate significant levels of heat while in operation. Submount assemblies, therefore, in some embodiments, would benefit from design features that facilitate heat dissipation. In the inventive submount assembly 1505, one or more of a thermally conductive dielectric layer is incorporated into the inventive submount assembly 1505 with the inventive dielectric stack 1540 to facilitate dissipation of thermal energy from the submount assembly 1505.

In the cross section shown in FIG. 15A of an embodiment for the inventive submount assembly 1505, a thermally conductive dielectric layer 1528 is disposed between the substrate 1510 and the interconnect layer 1520. In these and other embodiments, the thermally conductive dielectric material, such as aluminum nitride, for example, is combined with inventive submount assembly 1505 in conjunction with heat generating optoelectrical devices 1560 and inventive planar dielectric stack 1540. In embodiments, inclusion of heat-dissipating, thermally conductive dielectric layer 1528 with inventive dielectric stack structure 1540 improves the reliability of the submount assembly 1505 by providing thermally conductive pathways that allow for the transferring of heat from heat generating devices 1560 to heat sinks connected to the substrate 1510 or the submount assembly 1505. In preferred embodiments, thermally conductive dielectric layer 1528 is aluminum nitride or an alloy of aluminum nitride. In other embodiments, other thermally conductive dielectric material is used in submount assembly 1505 in conjunction with the optoelectrical devices 1560 and inventive planar dielectric stack 1540. In other embodiments, materials that are electrically conductive, such as the metal traces 1526 that are used in the interconnect layer 1520, are used to transfer heat from heat generating devices 1560 to the thermally conductive layers 1528 for conduction of heat to heat sinks on the submount assembly 1505.

Figure 15B:
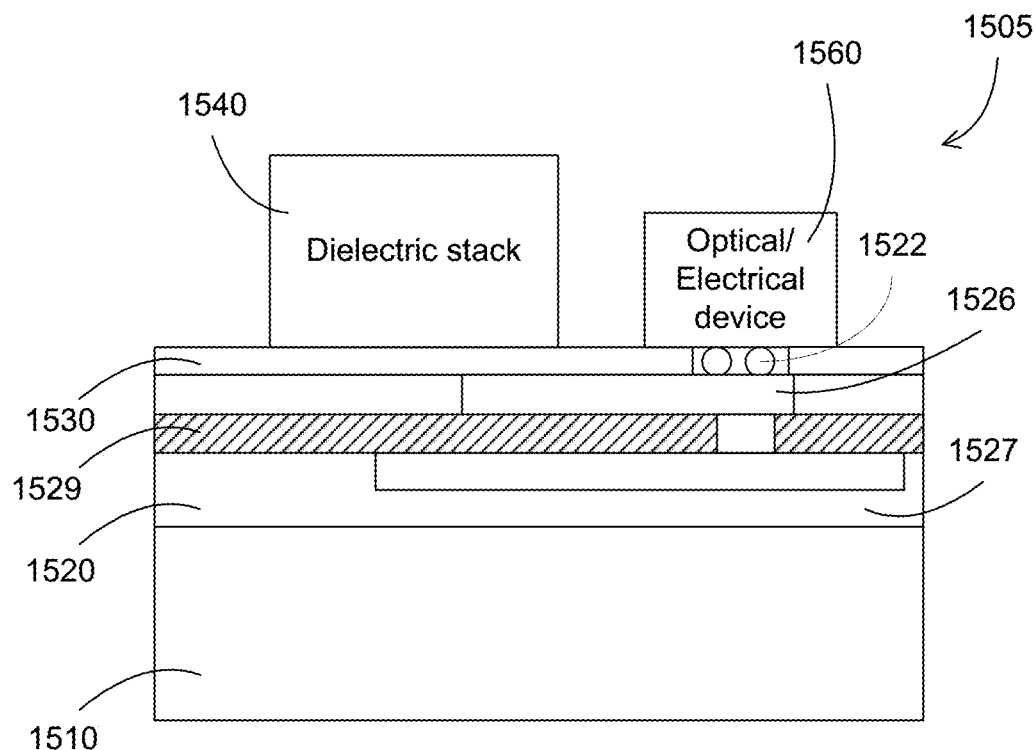

In other embodiments, as for example shown in FIG. 15B, a thermally conductive dielectric layer 1529 is positioned within the interconnect layer 1520. The metal traces 1526 in interconnect layer 1520, which are commonly composed of aluminum, copper, other metal, or combination of metals, generally have a high thermal conductivity, and can provide heat dissipation pathways from the heat generating optoelectronic device 1560 to the thermally conductive dielectric material 1529. The thermally conductive dielectric material 1529 is used in some embodiments to provide pathways that allow for the transferring of heat from the heat generating devices 1560 to one or more heat sinks connected to the submount assembly 1505.

Figure 16A:
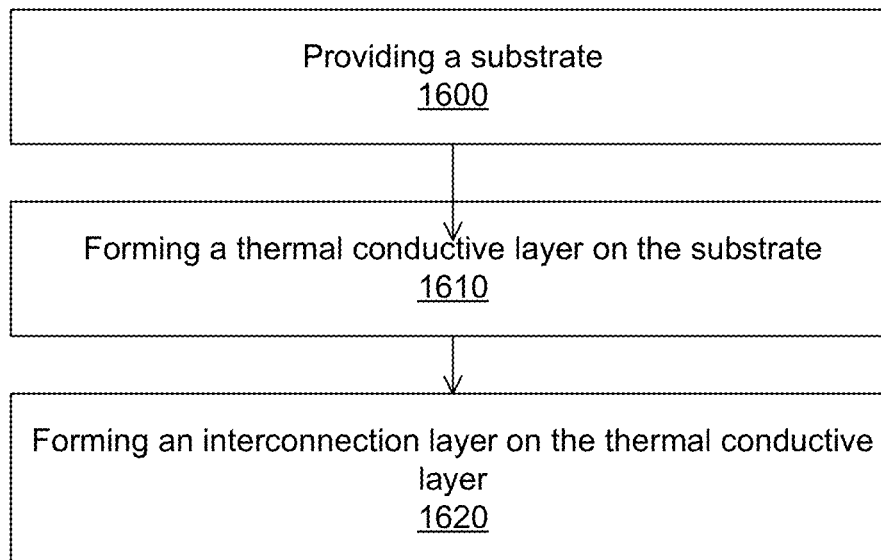
FIGS. 16A-16B show steps in the fabrication of embodiments of the inventive dielectric film structure for providing patterned dielectric waveguide structures with FIG. 16A interconnection layer formed on a thermal conductive layer, and FIG. 16B a high thermal conductivity dielectric layer within the interconnect layer.

Referring to FIG. 16A, a sequence of steps for forming a substrate with a thermally conductive layer and an interconnection layer used in embodiments of the inventive dielectric interposer 1500 is shown. These steps, which include the formation of a thermally conductive layer are shown that include a providing step 1600, a first forming step 1610, and a second forming step 1620, as described herein. In providing step 1600, a substrate is provided whereon a thermally conductive layer is formed in first forming step 1610. In the second forming step 1620, an interconnection layer is formed on the thermally conductive layer. The sequence of steps shown in FIG. 16A is one method for preparing a substrate with a thermal layer 1580 and an interconnect layer 1520 in preparation for the deposition of the inventive dielectric stack 1540, and the resulting formation of the inventive dielectric interposer 1500. In embodiments, the thermal layer 1528 is a heat sink for the removal of excess heat from devices 1560, for example. In other embodiments, the thermal layer 1528 provides a thermally conductive pathway for the transfer of heat from heat-generating devices 1560 to heat sinks on or connected in some way to the sub-mount assembly 1505.

Figure 16B:
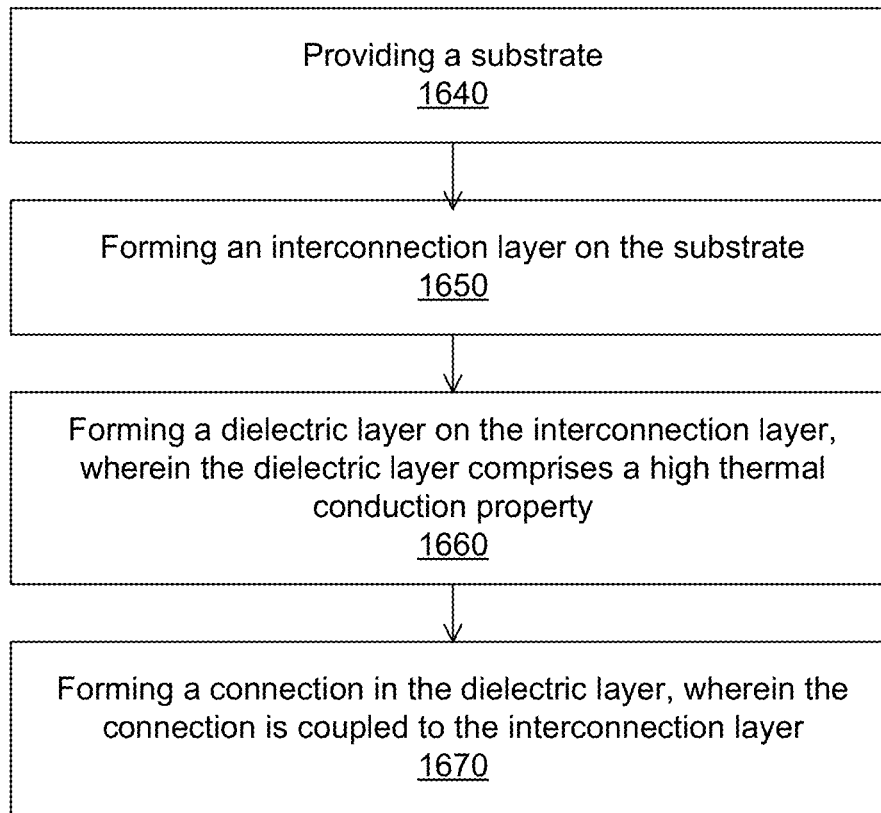

In FIG. 16B, steps for forming other embodiments of the inventive dielectric interposer 1500 with a thermally conductive dielectric layer are shown. The steps in FIG. 16B include a providing step 1640, a first forming step 1650, a second forming step 1660, and a third forming step 1670. In providing step 1640, a substrate 1510 is provided for the dielectric interposer 1500. In first forming step 1650, a whole or part of an interconnect layer is formed on the substrate 1510. In some embodiments, first forming step 1650 includes the formation of a part of the interconnect layer, that is, one or more layers of the interconnect layer 1520 but not the complete thickness of the interconnect layer. In other embodiments the thermally conductive dielectric layer 1529 is formed on the interconnect layer 1520. It is important to note that the thermally conductive layer can be formed at one or more of various positions in the interposer structure 1500 and remain within the scope of the current invention. Embodiments for the thermally conductive dielectric layer, for the purposes of providing a heat sink or a pathway to a heat sink include one or more of a thermally conductive layer 1528 on the substrate 1510, a thermally conductive layer 1529 on the interconnect layer 1520, and a thermally conductive layer 1529 within the interconnect layer 1520, as described herein. The thermally conductive layer, in some embodiments, is partially at one height in the interconnect layer 1520, and is partially at one or more other heights in the interconnect layer 1520. For example, a thermally conductive layer 1528 may be on the substrate 1510 for part of the submount assembly 1505 and then partially at another height within the interconnect layer 1520. In these embodiments, connections between the levels of the thermally conductive layers can be provided using the same thermally conductive material as in the thermally conductive layers 1529, a metal layer 1526, or an intermetal dielectric 1527. In preferred embodiments, the use of the same thermally conductive material to connect multiple thermally conductive layers 1528, 1529 is expected to produce the most efficient heat transfer although this approach might also have increased processing costs in some embodiments.

The second forming step 1660, for embodiments in which the thermally conductive layer 1529 is formed within the interconnect layer 1520, is typically followed by completion of the remaining layers of the interconnect layer 1520. In these embodiments, electrical connections 1526 may be required in some embodiments through the thermally conductive dielectric layer 1529 to connect underlying integrated electrical devices (see integrated device 964, for example) or to connect underlying connection layers 1526 that reside below the thermally conductive layer 1529. Third forming step 1670 includes the forming of an electrical connection in or through the dielectric layer that contains a thermally conductive dielectric layer 1529 to one or more of the interconnection layers 1526 that reside in the dielectric layer and in some embodiments to underlying integrated electrical devices (see integrated electrical device 964, for example). Similarly, for embodiments in which the thermally conductive layer 1529 is deposited on the complete, or partially completed, interconnect layer 1520, third forming step 1670 also includes the forming of electrical connections 1526 through the thermally conductive dielectric layer 1529 and the forming of one or more connections in or through this thermally conductive layer 1529 to one or more of the interconnection layers 1526 that reside below the thermally conductive dielectric layer 1529. In embodiments in which the interconnect layer 1520 is nearly completed, the thermally conductive layer 1529 may form the uppermost dielectric layer in the structure of the interconnect layer 1520.

It is important to note that the thermally conductive layer 1528, 1529 can be incorporated into the inventive interposer 1500 in various ways and remain within the scope of the current invention. FIG. 16B shows steps in the formation of some embodiments of the inventive dielectric interposer 1500 with the inventive dielectric stack 1540 for which a thermally conductive dielectric layer 1528, 1529 is included as described herein. In embodiments, the thermally conductive dielectric layer 1528, 1529 is one or more of a heat sink for the removal of excess heat from devices 1560, for example, and a thermally conductive pathway for the transfer of heat from heat-generating devices 1560 to heat sinks on or connected to the sub-mount assembly 1505. The combination of heat-removing layers 1528, 1529 with the heat generating devices 1560 and integrated planar dielectric waveguides formed from the inventive dielectric stack structure 1540 are beneficial for enhancing the reliability of submount assemblies that are uniquely enabled by this combination.

Figure 17A:
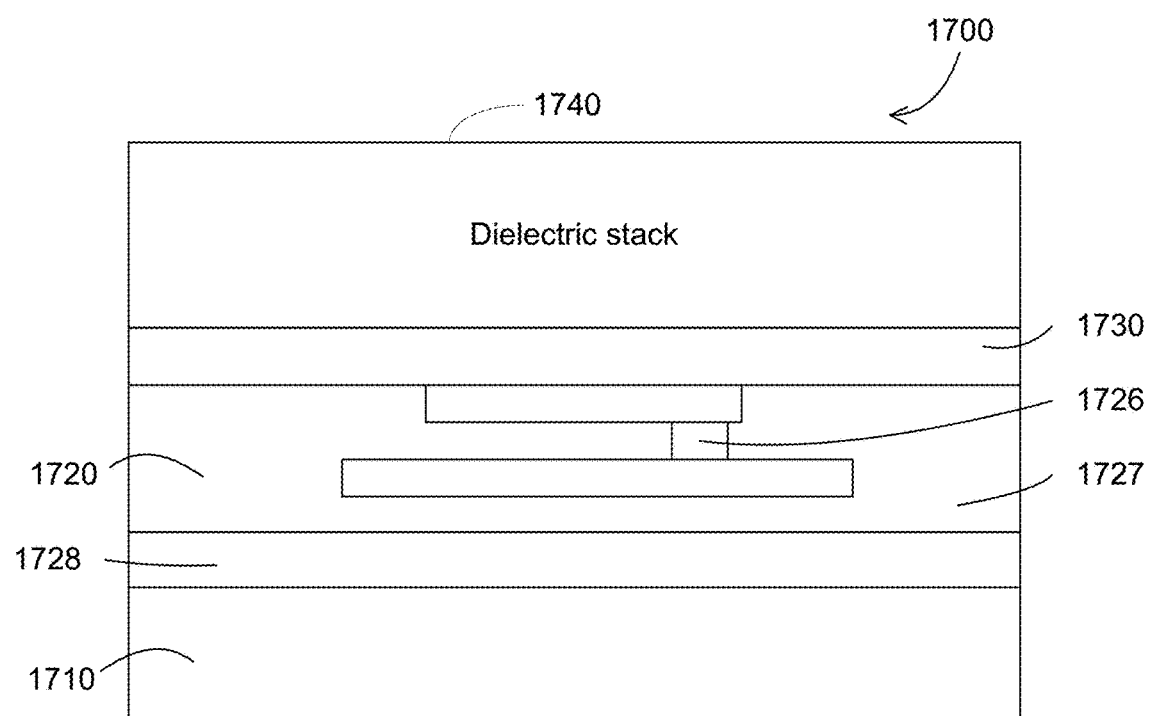
FIG. 17A-17D show a cross sectional schematic view of embodiments of integrated planar waveguides on a substrate shown FIG. 17A with unpatterned dielectric waveguide stack, FIG. 17B patterned dielectric waveguide structure with resulting cavity shown in cross section and, in the inset, in a perspective view, FIG. 17C with patterned dielectric waveguide structure and with mounted optical/electrical die within the cavity, and FIG. 17D with patterned dielectric waveguide structure, mounted optical/electrical die, and hermetic sealing cap.
Figure 17B:
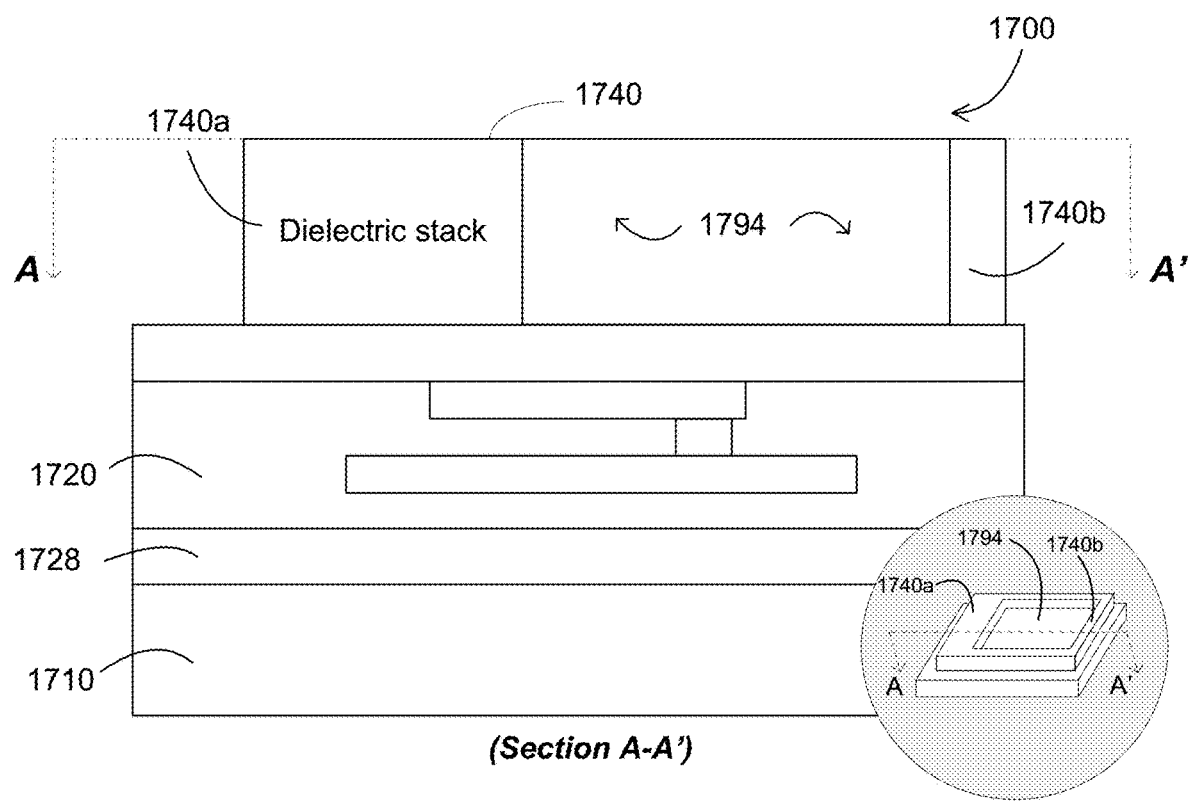

Referring to FIG. 17A, a cross sectional schematic of an unpatterned inventive dielectric stack 1740 is shown for embodiments of the inventive dielectric interposer 1700 formed on substrate 1710 for embodiments with optional thermally conductive layer 1728, interconnect layer 1720, and buffer layer 1730. Patterning of inventive dielectric stack 1740 from FIG. 17A yields inventive dielectric stack section 1740*a* and inventive dielectric stack section 1740*b* as shown in the cross-sectional schematic in FIG. 17B. In preferred embodiments, dielectric stack section 1740*a* and dielectric stack section 1740*b* form cavity 1794. The inset in FIG. 17B shows a perspective view of the top surface of inventive interposer 1700 after patterning of the dielectric stack 1740 to form dielectric stack sections 1740*a*, 1740*b*, and the cavity 1746.

Figure 17C:
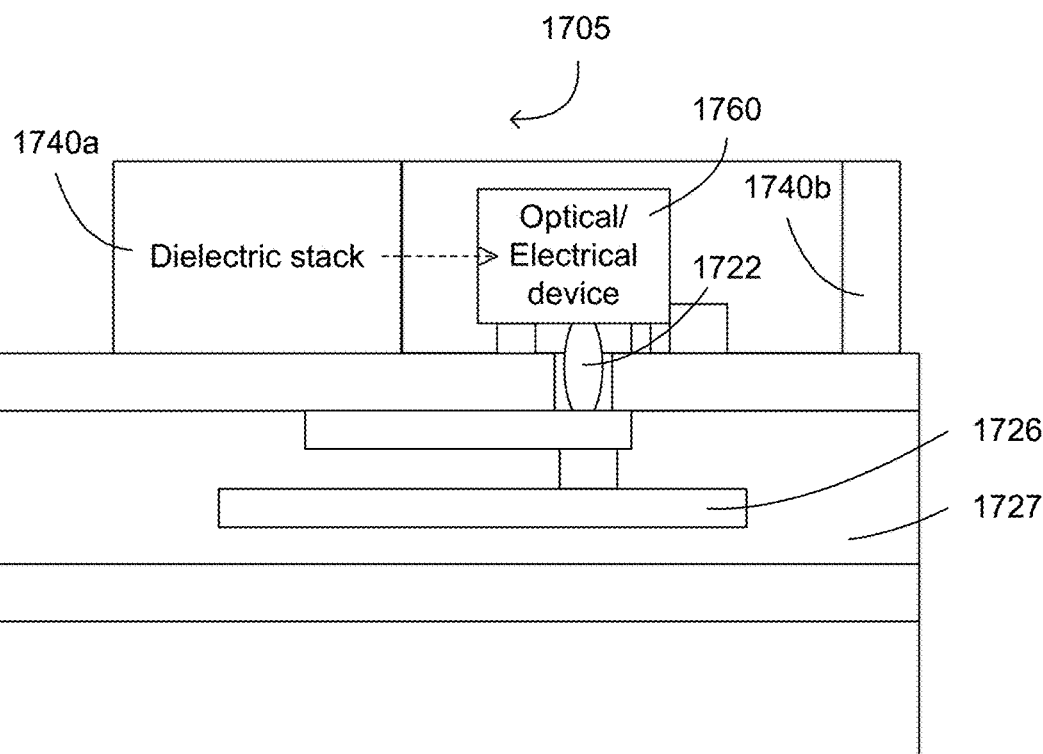

Referring to FIG. 17C, a schematic cross section of inventive dielectric interposer 1705 is shown with optoelectrical device 1760 within cavity 1794. In some embodiments, the optoelectrical device 1760 is connected with bond pad 1722 to the underlying metallization 1726 in the interconnect layer 1720 through openings in buffer layer 1730. Metallization traces 1726 generally form interconnections between the various electrical devices on and within the interposer and are shown for general demonstrative purposes in FIG. 17, and in other figures, and not intended to show a specific patterns or structures for the interconnections. Metallization layers 1726 provide interconnections between electrical and optoelectrical devices mounted onto the interposer 1700, to integrated electrical devices in the substrate (see integrated electrical device 964, for example), and to other devices and other submount assemblies connected to submount assembly 1705.

Figure 17D:
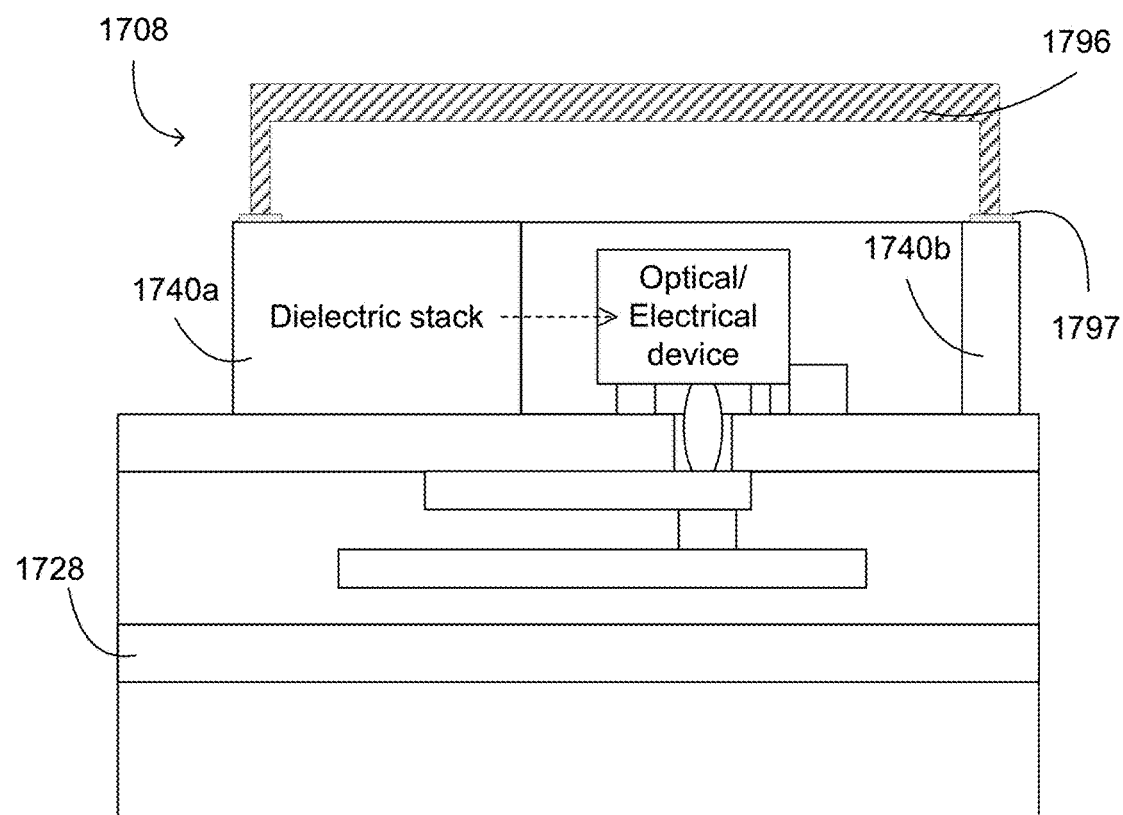

In FIG. 17D, a cross sectional schematic of cap 1796 on submount assembly 1705 to create capped optoelectronic package 1708 is shown. In some embodiments, cap 1796 is provided to seal the cavity 1794, and to provide hermetically sealed protection of the submount assembly within the cavity 1794. Cap 1796 is coupled to the cavity walls formed from dielectric stack sections 1740*a*, 1740*b*, formed from the inventive dielectric stack structure 1740, to cover and protect the optoelectric devices 1760 mounted within the cavity 1746. In typical preferred embodiments, a metal seal 1797 is utilized to bond the cap 1796 to the cavity walls 1740*a*, 1740*b*. In other embodiments, the seal or bond layer 1797 between the cap 1796 and the mechanical supports can be made from materials such as adhesive resins, solder material, and the like. The cap 1796 is shown mounted directly on the inventive dielectric stack structure 1740, but it should be understood that additional layers can be formed above the dielectric stack structure 1740 for various reasons that include one or more of improved bonding layer adhesion, vertical height adjustment, alignment, and provision for positional stops, among other reasons, and remain within the scope of the current invention.

Figure 18:
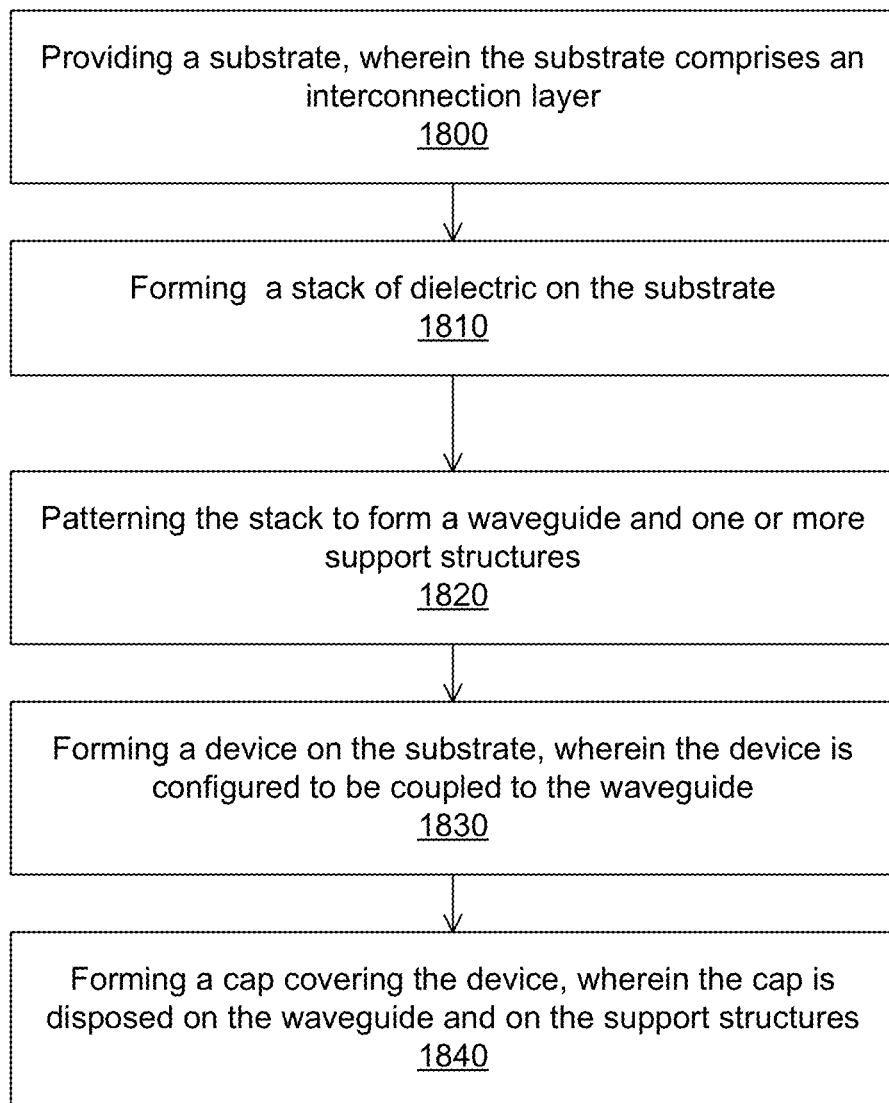
FIG. 18 shows steps in the fabrication of embodiments of the inventive dielectric film structure for the formation of integrated planar waveguides and mechanical support structures to support hermetic sealing.

In FIG. 18, the steps for providing a capped submount assembly 1708 from inventive submount assembly 1705 using inventive dielectric stack structure 1740 are shown and include a providing step 1800, a first forming step 1810, a first patterning step 1820, a second forming step 1830, and a third forming step 1840 as described herein for some embodiments. In the providing step 1800, a substrate 1710 that includes an interconnection layer 1720 is provided. In some embodiments, the substrate 1710 has a thermally conductive layer 1728 on substrate 1710 or within the interconnect layer 1720. In some other embodiments, the substrate 1710 does not have a thermally conductive layer 1728 on or in substrate 1710, or on or within the interconnect layer 1720. In a first forming step 1810, inventive dielectric stack 1740 is deposited onto the interconnect layer 1720. Inventive dielectric stack 1740 is patterned in first patterning step 1820 to form a waveguide from the inventive dielectric stack 1740 and one or more support structures 1740*a* and 1740*b* that are also formed from the inventive dielectric stack 1740. An embodiment of support structures is shown for example in FIGS. 17B-D. In a second forming step 1830, a device 1760, for example, is formed on the substrate, wherein the device is configured to couple to the waveguide formed from the dielectric stack 1740. In the third forming step 1840, a cap 1796 is positioned to cover the device that is coupled to the waveguide, by disposing the cap 1796 on the dielectric stack structure 1740 patterned to form a waveguide 1740*a*, which also serves as a mechanical support structure, and the support structures 1740*b*. The benefit of using the inventive dielectric stack as both a mechanical support and a waveguide enables the use of the waveguide to transmit light signals into the cavity and out from devices mounted within the cavity while providing a capability for hermetic sealing. The transmission of light through planar waveguides formed from the inventive dielectric film structures 1740 can be used to facilitate the transmission or receiving, or both, of optical signals from optical fibers mounted external to the cavity, through the cavity walls 1740*a*, to or from devices 1760 mounted within the cavity 1794.

In the cross sections of the embodiments for the inventive interposers and submount assemblies shown and described herein, it should be understood that waveguides fabricated from inventive dielectric stack 140, 740, 940, 1040, and 1140, in some embodiments can be a small section of waveguide aligned to an optical or electrical device, for example, for the transmission of optical signals to and from an optical fiber connected to the submount assembly. In other embodiments, these waveguides can include sections of the inventive dielectric stack 140 that are patterned spot size converters, filters, arrayed waveguides, multiplexers, demultiplexers, gratings, power combiners, and the like. In yet other embodiments, these waveguides can provide part of a mechanical structure for the formation of hermetic seals. In yet other embodiments, theses waveguides can be a combination of one or more of these types of structures fabricated from the inventive dielectric stack structure 140. In yet other embodiments, the buffer layer and the layers of the repeated stack are patterned to form a filter, an arrayed waveguide, a grating, a multiplexer, a demultiplexer, a spot size converter, or a power combiner.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and remain within the spirit and scope of the present invention.

What is claimed is:

1. A method comprising depositing multiple layers of films on a substrate,
   wherein the multiple layers of films comprises a stack of silicon oxynitride films; and
   patterning the multiple layers of films to form a waveguide with the stack of films being a core of the waveguide,
       wherein at least a silicon oxynitride film in the stack of silicon oxynitride films is deposited using a plasma enhanced chemical vapor deposition (PECVD) process,
       wherein process gases in the PECVD process comprise a silicon-containing precursor not containing hydrogen and one or more precursors for oxygen and nitrogen, and
       wherein the one or more precursors of oxygen and nitrogen comprise an amount of hydrogen less than 10% of the process gases.

2. A method as in claim 1,
   wherein the amount of hydrogen is less than 5% of the process gases.

3. A method as in claim 1,
   wherein the process gases comprise a hydrogen-free chemistry.

4. A method as in claim 1,
   wherein the process gases comprises less than 10% ammonia.

5. A method as in claim 1,
   wherein the one or more precursors for oxygen and nitrogen comprise at least one of a precursor for oxygen and a precursor for nitrogen,
       a precursor for oxygen, and a precursor for nitrogen and oxygen, or
       a precursor for nitrogen, and a precursor for nitrogen and oxygen.

6. A method as in claim 1,
   wherein ratios of process gases are configured to achieve a stoichiometry for the silicon oxynitride films that exhibits an index of refraction between 1.55 and 2.05, and
   wherein ratios of process gases are configured to achieve a stress level less than 25 MPa in magnitude.

7. A method as in claim 1,
   wherein the at least a silicon oxynitride film comprises a stress level less than 25 MPa in magnitude, or
   wherein the stack of silicon oxynitride films comprises a stress level less than 25 MPa in magnitude, or
   wherein individual silicon oxynitride films in the stack of silicon oxynitride films have a stress level less than 25 MPa in magnitude.

8. A method as in claim 1,
   wherein the at least a silicon oxynitride film is formed using process temperatures less than 500 C to prevent damages to the substrate.

9. A method as in claim 1,
   wherein the substrate comprises an interconnection layer comprising an electrical interconnection line.

10. A method as in claim 1,
   wherein the substrate comprises an interconnection layer formed on an electrical device, and
   wherein the interconnection layer comprises an electrical interconnection line electrically connected to a terminal of the electrical device.

11. A method comprising
depositing multiple layers of films on a substrate,
- wherein the multiple layers of films comprises a stack of silicon oxynitride films; and patterning the multiple layers of films to form a waveguide with the stack of films being a core of the waveguide,
- wherein at least a silicon oxynitride film in the stack of silicon oxynitride films is deposited using a plasma enhanced chemical vapor deposition (PECVD) process, and
- wherein process gases in the PECVD process comprise an amount of hydrogen configured to form the at least a silicon oxynitride film having a stress level less than 25 MPa in magnitude or configured to form the at least a silicon oxynitride film using process temperatures less than 500 C to prevent damages to the substrate.

12. A method as in claim 11,
wherein the amount of hydrogen is less than 10% of the process gases.

13. A method as in claim 11,
wherein the process gases comprises a precursor for silicon, a precursor for nitrogen, and a precursor for oxygen, and
wherein at least one of the precursor for silicon, the oxygen precursor, or the nitrogen precursor comprises a hydrogen-free chemistry.

14. A method as in claim 11,
wherein the at least a silicon oxynitride film is formed using process temperatures less than 400 C to prevent damages to the substrate.

15. A method as in claim 11,
wherein the substrate comprises an interconnection layer comprising an electrical interconnection line.

16. A method comprising
depositing multiple layers of films on a substrate,
- wherein the multiple layers of films comprises a stack of silicon oxynitride films; and patterning the multiple layers of films to form a waveguide with the stack of films being a core of the waveguide,
- wherein at least a silicon oxynitride film in the stack of silicon oxynitride films is deposited using a plasma enhanced chemical vapor deposition (PECVD) process, and
- wherein process gases in the PECVD process comprise an amount of hydrogen configured to form the at least a silicon oxynitride film, as-deposited, having a level of optical loss of less than 1 dB/cm.

17. A method as in claim 16,
wherein the amount of hydrogen is less than 10% of the process gases.

18. A method as in claim 16, wherein process gases comprise a silicon-containing precursor not containing hydrogen.

19. A method as in claim 16,
wherein the waveguide is formed using process temperatures less than 500 C to prevent damages to the substrate, and
wherein ratios of process gases are configured to achieve a stress level less than 25 MPa in magnitude.

20. A method as in claim 16,
wherein the substrate comprises an interconnection layer formed on an electrical device, and
wherein the interconnection layer comprises an electrical interconnection line electrically connected to a terminal of the electrical device.

* * * * *